United States Patent [19]

Kazami et al.

[11] Patent Number: 5,159,433
[45] Date of Patent: Oct. 27, 1992

[54] HYBRID INTEGRATED CIRCUIT DEVICE HAVING A PARTICULAR CASING STRUCTURE

[75] Inventors: Akira Kazami, Ashikaga; Osamu Nakamoto, Ohta; Hisashi Shimizu; Katsumi Ohkawa, both of Ohta; Yasuhiro Koike, Ojima; Koji Nagahama, Ohta; Masao Kaneko, Maebashi; Masakazu Ueno, Ohta; Yasuo Saitou, Yabutukahonmachi, all of Japan

[73] Assignee: Sanyo Electric Co., Ltd., Osaka, Japan

[21] Appl. No.: 510,468

[22] Filed: Apr. 18, 1990

[30] Foreign Application Priority Data

| Apr. 20, 1989 | [JP] | Japan | 1-100783 |
| Apr. 20, 1989 | [JP] | Japan | 1-100784 |
| Apr. 20, 1989 | [JP] | Japan | 1-100787 |
| May 12, 1989 | [JP] | Japan | 1-119111 |
| May 12, 1989 | [JP] | Japan | 1-119112 |
| May 15, 1989 | [JP] | Japan | 1-120902 |
| May 15, 1989 | [JP] | Japan | 1-120903 |
| May 15, 1989 | [JP] | Japan | 1-120904 |
| May 15, 1989 | [JP] | Japan | 1-120905 |
| May 15, 1989 | [JP] | Japan | 1-120907 |
| May 17, 1989 | [JP] | Japan | 1-123902 |
| May 19, 1989 | [JP] | Japan | 1-127311 |
| May 19, 1989 | [JP] | Japan | 1-127312 |

[51] Int. Cl.$^5$ .................. H01L 23/04; H01L 23/12; H01L 23/14
[52] U.S. Cl. ........................ 357/75; 357/74
[58] Field of Search .............. 357/74, 75, 80; 174/52.4; 361/392, 393, 394, 395, 413

[56] References Cited

U.S. PATENT DOCUMENTS

| 4,742,385 | 5/1988 | Kohmoto | 357/75 |
| 4,970,577 | 11/1990 | Ogihara et al. | 357/75 |
| 5,045,922 | 9/1991 | Kodama et al. | 357/74 |
| 5,061,990 | 10/1991 | Arakawa et al. | 357/80 |

Primary Examiner—Rolf Hille
Assistant Examiner—S. V. Clark
Attorney, Agent, or Firm—Spensley Horn Jubas & Lubitz

[57] ABSTRACT

In a position closest to the mounting position of a microcomputer in a casing of a hybrid integrated circuit device on which is mounted the microcomputer and its peripheral circuit elements, an insertion hole is formed for a non-volatile memory which feeds data to the microcomputer. A socket for connecting the non-volatile memory is provided at the bottom of this insertion hole. Because of this configuration it is possible to connect the microcomputer and the non-volatile memory at an extremely short distance and the mounting efficiency of the integrated circuit device is increased. In addition, the non-volatile memory can detachably be mounted. Furthermore, the external shape of the insertion hole for the non-volatile memory is essentially the same as the external shape of the non-volatile memory so that when the non-volatile memory is inserted, the entire surface of this hybrid integrated circuit device is almost flat, providing excellent handling characteristics.

31 Claims, 20 Drawing Sheets

HYBRID INTEGRATED CIRCUIT DEVICE HAVING A PARTICULAR CASING STRUCTURE

BACKGROUND OF THE INVENTION

1. Field of the Invention

The present invention relates to a hybrid integrated circuit device with a built-in microcomputer and, in particular, to a hybrid integrated circuit device provided with a non-volatile memory which feeds data to the microcomputer, and which can be treated as an electronic part which functions independently.

2. Description of the Background Art

An EPROM element with an ultraviolet light irradiation window provided in its surface by which it is possible to erase stored data written on a chip by ultraviolet irradiation and rewrite into that memory is preferably used in various types of electronic devices. These EPROM elements are usually mounted on a printed board provided that they can detachably be mounted for subsequent rewriting. Most of these EPROM are mounted together with a control- or drive-integrated circuit on a printed board.

For electronic devices which must be small and light-weight, a technique known as "chip-on-board" is adopted, wherein a semiconductor integrated circuit (IC) chip is directly mounted on a printed board, and after the required wiring is implemented, the IC chip and the wiring section are covered with a synthetic resin. However, in an electronic device for which an EPROM element is required, because it must be possible to erase the stored data by directing ultraviolet light onto the EPROM element, and to rewrite into the element, the chip-on-board technique whereby an EPROM chip is mounted directly on a printed board and covered with a synthetic resin cannot be adopted. For this reason, in an electronic device for which an EPROM element is required, there is no other choice but to use an EPROM element incorporated in a SADIP-type package. The development of an small-size, light-weight unit is hence hindered.

FIG. 1 is a perspective drawing of an EPROM substrate, which explains the mounting structure of a conventional EPROM element. One part of an EPROM element 44 is shown in section.

A plurality of through-hole terminals 43 and a plurality of male connector terminals 55 made of conductive material are formed on the main surface of an insulating substrate 42 made from glass-epoxy resin or other similar material. In addition, a conductive wire pattern 41 is also formed, mutually connected to the through-hole terminals 43 and the male connector terminals 55. An external conductive lead 48 of the EPROM element 44 incorporated into a SADIP-type package is inserted through the through-hole terminal 43 and electrically connected by soldering to the through-hole terminal 43. In addition, the external conductive lead 48 is mechanically secured to the insulated substrate 42.

The EPROM element 44 is provided with a ceramic header 45 and a ceramic cap 46. The external conductive lead 48 is bonded to the header 45 using a glass material with a low melting point. An element mounting section 50 which is produced from a sintered gold paste made up of a large quantity of gold powder mixed with glass is also bonded directly to the header 45, or indirectly to the header through the low melting point glass material which is extended to the element mounting section 50. An EPROM chip 51 with an ultraviolet emitting surface on the top is mounted on the element mounting section 50. An electrode of the chip 51 is connected to the external conductive lead 48 with a fine metal wire 52. The cap 46 is a cover member provided with a window 53 vis-a-vis the ultraviolet emitting surface of the EPROM chip 51. The cap 46 is bonded to the header 45 using a low melting point glass, and it seals the EPROM chip 51 which is positioned on the header 45. The EPROM substrate having the above structure is formed independently of the main circuit print board. The EPROM element 44 is connected to a microcomputer or the like mounted on the main circuit print board. This connection is made through the external conductive lead 48, the through hole terminal 43, the conductive wire pattern 41, a male connector terminal section 55, and a female connector (omitted from the drawings).

The external form of a package when such a conventional EPROM element mounting method is used is extremely large in comparison with the EPROM chip 51. In addition to occupying a large area in plan view, the height of the elements is also several times the height of the chip, which is a severe handicap in providing a thin-type printed board. After the external conductive lead 48 is inserted into the through hole terminal 43, the EPROM element must be secured by solder or the like. In addition, a particularly troublesome drawback is the fact that, before mounting on the insulated substrate, the EPROM element must once be assembled in the package. Because the EPROM element is provided with an ultraviolet emitting window, the package is assembled in a SADIP-type package made from a ceramic and, because this package is sealed in low melting point glass, a high temperature (400° C. to 500° C.) sealing process is adopted. If the electrode (aluminium) of the EPROM chip and the fine metal wire which connects the electrodes (aluminum) of the EPROM chip to the external conductive lead are not made from the same type of material, an alloy is produced at the sealed section during the high temperature sealing process and the resistance of the wire increases. This can cause the wire to break. A fine aluminum wire is usually used to avoid this kind of trouble, but, in this EPROM chip, the earth electrode of the EPROM chip is wired to the mounting section of the chip which is formed with gold paste, because the substrate of the EPROM chip must bear earth potential. Here as well, there is a tendency for a binary or multiple alloy reaction to occur between the gold in the gold paste and/or the metal in the metal foil or the like, and the aluminum. For the above reason, a small silicon leaf covered with aluminum on the head referred to as a gland die, is attached to the chip mounting section formed from the gold paste, and the earth electrode of the EPROM is connected to the top of the gland die. The conventional mounting structure has many drawbacks accompanied by the above complicated process. Thus, the conventional mounting structure does not satisfy any of the requirements for small size, light weight, and low cost.

The EPROM mounting structure shown in FIG. 2 has been proposed to eliminate this type of problem. This mounting structure will now be explained with reference to the drawing.

An insulated substrate 60 made from a glass-epoxy resin or other similar material has a main surface 60a on which is formed a wiring pattern 60b. A chip mounting area 60c which supports an EPROM chip 61 is provided on the insulated substrate 60. The wiring pattern 60b is routed on the main surface 60a from a point close to the area 60c and is connected to a male connector terminal (omitted from the drawing). The EPROM chip 61 is mounted on the area 60c. A surface electrode of the chip 61 is connected to the wiring pattern 60b by a fine metal wire 62. The substrate of the EPROM chip 61 as well is connected to the mounted wiring pattern 60b by one strand of the fine metal wire 62. An ultraviolet transmitting window material 64 of the EPROM chip 61 is fixed on the ultraviolet-emitting surface 61a of the EPROM chip 61 through an ultraviolet transmitting resin 63 [for example, TX-978 (trademark), manufactured by Toray].

The window material 64 is made from a commonly known ultraviolet transmitting material such as quartz, transparent alumina, or the like. The top surface 64a of the window material 64 is a surface which introduces light to the ultraviolet-emitting surface 61a of the EPROM chip 61. The parts of the window material 64 other than the top surface 64a, the fine metal wire 62, and the part connecting the fine metal wire 62 with the wiring pattern 60b are covered with a synthetic resin 65 [for example, MP-10 (trademark), manufactured by Nitto Denko Corp.]. If the base of the chip mounting area 60c of the substrate 60 is situated on a concave at about half the height of the substrate 60, it is possible to further reduce the combined thickness of the insulated substrate 60, the EPROM chip 61, and the window material 64, while formation of a floodgate by the synthetic resin 65 effectively prevents moisture from entering. The EPROM mounting structures shown in FIG. 1 and FIG. 2 are disclosed in Japanese Patent Laid-open No. 83393/1985 (HO5K 1/18).

Because the EPROM chip is die-bonded to the printed board in the EPROM mounting structure shown in FIG. 2, the printed board is reduced in size by only the amount of reduction of the EPROM. However, although it is not shown in FIG. 2, because the microcomputer which is to be fixed near the EPROM chip and its peripheral circuit elements are fabricated as discrete electronic parts, the problem remains that most of the size reduction is not achieved, if the printed board on which the EPROM is mounted is viewed as a system. In addition, in the EPROM having the structure illustrated in FIG. 2, rewriting of program data onto the EPROM chip must be performed after the program data has been erased by exposing the printed board to ultraviolet light, and by touching a write-in terminal, such as a probe or the like, to the conductive pattern extending from the EPROM chip. For this reason, usual conventional ROM writers cannot be used. This entails a problem of troublesome in rewriting onto an EPROM.

Also, with the EPROM mounting structure shown in FIG. 1, the EPROM can detachably be mounted on the main printed board, so that a usual ROM writer can be used for writing. However, in the same manner as with the mounting structure shown in FIG. 2, the circuits around the EPROM, specifically, the microcomputer and its peripheral circuit elements, such as LSIs, ICs, and the like, are constructed as discreet electronic parts in the same manner as in FIG. 2. This causes the printed board as well as the total system to be large in size, making it impossible to provide a small and light integrated circuit as the user requires. This is a major problem. In addition, an independent printed board for the EPROM element is required, and the wiring pattern 41 for connecting the EPROM element 44 to a microcomputer becomes very long, bringing about the problem that size reduction cannot be achieved.

With the EPROM mounting structures shown in FIG. 1 and FIG. 2, the complete system becomes large, as outlined above. In addition, because the conductive pattern which connects the EPROM and the peripheral circuit elements are exposed, reliability is lowered.

Furthermore, with the EPROM mounting structures shown in FIG. 1 and FIG. 2, because the EPROM and its peripheral microcomputer and circuit elements, such as LSIs, ICs, and the like are exposed, irregularities are formed on the upper surface of the substrate, reducing operability and making servicing difficult.

SUMMARY OF THE INVENTION

Accordingly, a first object of the present invention is to provide a hybrid integrated circuit device: which is provided with a microcomputer and a built-in non-volatile memory which feeds data to the microcomputer; and which functions as an independent electron device.

A second object of the present invention is to provide a hybrid integrated circuit device with a built-in non-volatile memory whereby data in the built-in non-volatile memory can easily be erased and rewritten according to various specifications or modifications.

A third object of the present invention is to provide a compact and simple hybrid integrated circuit device which can comply with various user's specifications with ease, and which can be handled as a single electron device as a whole.

A fourth object of the present invention is to provide a hybrid integrated circuit device with a high degree of integration wherein a peripheral printed circuit board can be diminished or omitted.

A fifth object of the present invention is to provide a hybrid integrated circuit device with a built-in non-volatile memory wherein data in the non-volatile memory can easily be erased and built-in circuit elements are completely sealed.

A sixth object of the present invention is to provide a compact and simple hybrid integrated circuit device for which commercially available non-volatile memories with an optional structure or shape can be used, and which can be handled as a single electron device.

A seventh object of the present invention is to provide a hybrid integrated circuit device with a built-in non- c volatile memory wherein the non-volatile memory can arbitrarily be positioned and the layout of the circuit elements on an integrated circuit substrate is designed with great ease.

Further object of the present invention is to provide an integrated circuit substrate structure and casing structure which have excellent heat characteristics and high mounting density to achieve the above objects.

These objects are all achieved by the provision of a first embodiment comprising: a metal integrated circuit substrate on which a plurality of conductive paths with a specified pattern is formed through insulated layers; a non-volatile memory connected to the conductive path; a microcomputer and its peripheral circuit elements to which data is fed from the non-volatile memory; and a box-shaped casing integrally formed and secured to the integrated circuit substrate, wherein, in the position closest to the mounting position of the microcomputer in the casing, an insertion hole or cavity for the non-volatile memory which supplies data to the microcomputer is formed, and the non-volatile memory is positioned in the insertion hole or cavity. Also, the upper surface of the non-volatile memory and the upper surface of the casing are formed so that they are almost correspond. Especially, in the first embodiment, the non-volatile memory is completely embedded in the casing to prepare a compact and simple hybrid integrated circuit device.

The objects are also achieved in the same way in the present invention by the provision of a second embodiment comprising: a metal integrated circuit substrate on which a plurality of conductive paths with a specified pattern is formed; a microcomputer and its peripheral circuit elements; a casing provided with a hole at a specified position thereof, and integrally formed with and secured to the integrated circuit substrate; a socket which is perfectly inserted in the hole, and which is connected to a specified conductive path through the electrode of the socket using a pair of connectors; and a non-volatile memory which is inserted into the socket, wherein the microcomputer and the peripheral circuit elements are sealed in a sealed section formed by the casing and the integrated circuit substrate. In particular, by means of this second embodiment it is also possible to form conductive paths and mount the elements between two connectors, improving the mounting efficiency.

The objects are achieved in the same way in the present invention by the provision of a third embodiment comprising: an integrated circuit substrate on which is formed a plurality of conductive paths in a specified pattern; a non-volatile memory which is connected to a specified conductive path on the integrated circuit substrate; a microcomputer and its peripheral circuit elements which are supplied with data from the non-volatile memory and connected to a specified conductive path on the integrated circuit substrate; and a casing integrally formed with the integrated circuit substrate; wherein the integrated circuit substrate projects from the casing; the non-volatile memory is mounted on the projecting section; and the microcomputer and its peripheral circuit elements are positioned in a sealed space formed by the integrated circuit substrate and the casing. In particular, in the case where a non-volatile memory in the form of a chip is used, the erasure and rewriting of the data is easily accomplished.

The objects are achieved in the same way in the present invention by the provision of a fourth embodiment comprising: an integrated circuit substrate on which is formed a plurality of conductive paths in a specified pattern; a non-volatile memory; a connection means for connecting the non-volatile memory to a specified conductive path on the integrated circuit substrate; a microcomputer and its peripheral circuit elements which are supplied with data from the non-volatile memory and are connected to a specified conductive path on the integrated circuit substrate; and a casing integrally formed with the integrated circuit substrate; wherein a hole is formed at a specified position of the integrated circuit substrate; the connection means is hermetically sealed to the hole and one end of the electrode of the connection means is connected to a specified conductive path on the integrated circuit substrate; and the microcomputer and its peripheral circuit elements are positioned in a sealed space formed by the integrated circuit substrate and the casing. The fourth embodiment of the present invention wherein a hole is formed in one section of the position closest to the mounting position of the microcomputer on the integrated substrate, and the non-volatile memory is positioned in this hole by a suitable means, and wherein a metal integrated circuit substrate forms the upper surface of a hybrid integrated circuit device, in particular achieves superior heat dissipation capabilities and improved reliability.

In the hybrid integrated circuit device of the present invention having the above configuration, the non-volatile memory which requires the most numbers of bus-bars can be placed adjacent to the microcomputer, even if the microcomputer is optionally positioned in any place of the integrated circuit substrate. Accordingly, because the bus length between the computer and non-volatile memory is short, the mounting efficiency of the integrated circuit substrate is particularly improved, and the layout of the integrated circuit substrate can easily be designed.

In addition, because the circuit elements are fabricated in a die- or chip-form, the area occupied by these elements is small, improving the mounting efficiency of the integrated circuit substrate. Also, because a metal substrate is used as the integrated circuit substrate and a copper foil is used for the conductive path, the heat dissipation capability is excellent and the mounting density of the integrated circuit substrate is not limited by heat.

Further, because the microcomputer and the peripheral circuit elements are positioned in a sealed space formed by the integrated circuit substrate and the casing, and because the non-volatile memory is positioned in an open space and shielded with resins or seal material, the reliability of the circuit elements is improved and rewriting of data in the non-volatile memory is readily carried out.

Other objects, features and advantages of the invention will hereinafter become more readily apparent from the following description.

BRIEF DESCRIPTION OF THE DRAWINGS

FIG. 21 being a perspective drawing; FIG. 22, a sectional drawing viewed along the section I—I in FIG. 21; and FIG. 23, an expanded drawing of the same embodiment, showing the area around the EPROM on the integrated circuit substrate.

FIG. 25 being a block diagram of the hybrid integrated circuit device applicable to a MODEM; FIG. 26, a block diagram of the interface used; FIG. 27, a block diagram of a microcomputer; and FIG. 28, a plan drawing of the hybrid integrated circuit device shown in the block diagram of FIG. 25.

FIG. 29 being a perspective drawing; FIG. 30 a sectional drawing viewed along the section I—I in FIG. 29; and FIG. 31, an expanded drawing of the second embodiment, showing the area around the EPROM on the integrated circuit substrate.

FIG. 32 being a perspective drawing of the modification; FIG. 33, a sectional drawing viewed along the section I—I in FIG. 32; and FIG. 34, an expanded drawing of the modification, showing the area around the EPROM on the integrated circuit substrate.

FIG. 35 being a perspective drawing; and FIG. 36 a sectional drawing viewed along the section I—I in FIG. 35.

FIG. 37 being a perspective drawing; and FIG. 38 a sectional drawing viewed along the section I—I in FIG. 37.

DETAILED DESCRIPTION OF THE INVENTION AND PREFERRED EMBODIMENTS

Figure 1:
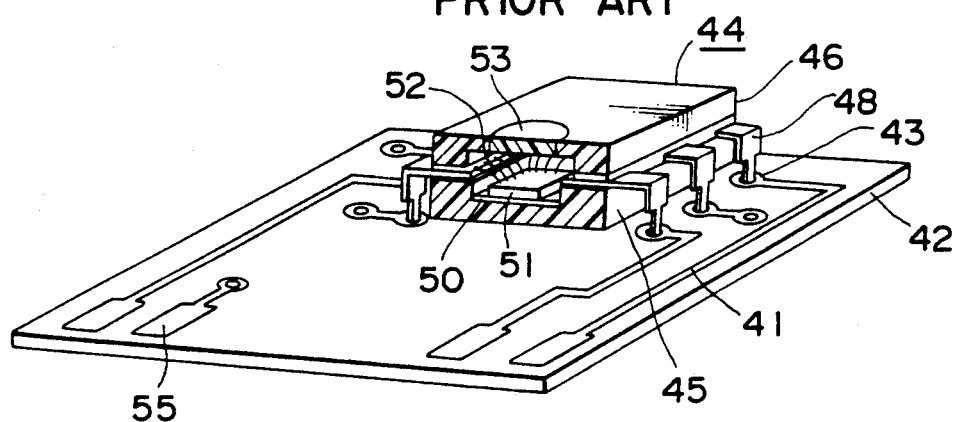
FIG. 1 and FIG. 2 are perspective drawings for explaining conventional EPROM mounting structures.
Figure 2:
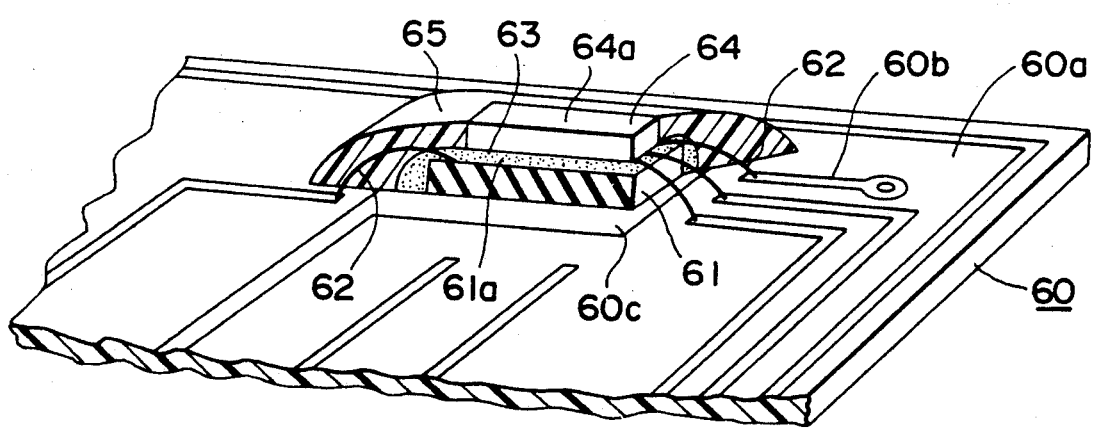

The hybrid integrated circuit device of the present invention can be used in any system that utilizes a microcomputer. In this field the device is used as an independent electronic part or as an independent functional part. A first embodiment of the present invention will now be explained in detail with reference to FIGS. 3 to 20.

Now referring to FIG. 3 and to FIG. 4 which is a sectional drawing viewed along the section I—I in FIG. 3, a hybrid integrated circuit device 1 of this embodiment comprises an integrated circuit substrate 2 on which a plurality of conductive paths 3 of a specified shape are formed; an insertion hole 7 (later-explained) in a specified position for a non-volatile memory; a casing 8 which is, at a final stage, integrally formed on the integrated circuit substrate 2; and a non-volatile memory 4. The integrated circuit substrate 2 is provided with a socket 15 for the insertion of the non-volatile memory 4. The insertion hole 7 for the non-volatile memory 4 is formed in the casing 8 in a position corresponding to the socket 15. A microcomputer 5 and its peripheral circuit elements 6 are secured to the integrated circuit substrate 2. Electrodes for the microcomputer 5, its peripheral circuit elements 6, and the socket 15 are mutually connected by the conductive paths 3. By means of this configuration, data in the non-volatile memory 4 inserted in the socket 15 is supplied to the microcomputer 5 and its peripheral circuit elements 6 through the conductive paths 3 and the socket 15.

Figure 5:
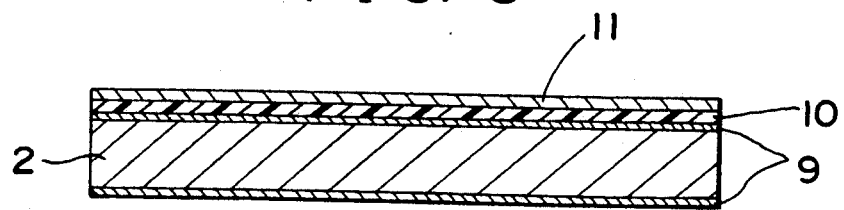
FIG. 5 is a sectional drawing of the integrated circuit substrate used in the present invention.

Next, the integrated circuit substrate 2 of the hybrid integrated circuit device 1 of the present invention will be explained in detail with reference to FIG. 5. Any hard substrate, such as a ceramic, glass-epoxy, or metal substrate may be used as the integrated circuit substrate 2. However in consideration of its heat dissipation characteristics, mechanical strength, and the like, an aluminum substrate 0.5 mm to 1.0 mm thick is used as the integrated circuit substrate 2 of the present invention. For convenience, the reference number for the integrated circuit substrate is applied to the aluminum substrate in FIG. 5. The aluminum substrate 2 is provided with an oxidized aluminum film 9 (alumite layer) on its surface, formed by means of a commonly known anodic oxidation process. An insulating resin layer 10 of epoxy, polyimide, or the like, 10 $\mu$m to 70 $\mu$m thick, is affixed to one main side of the aluminum substrate 2. Further, a copper foil 11, 10 $\mu$m to 70 $\mu$m thick, is affixed to the top of the insulating resin layer 10 by a means such as a roller or hot pressing means or the like. Because a copper foil affixed to an insulating resin layer is commercially available, a more practical method of affixing an insulating resin layer to an aluminium substrate and then a copper foil to the insulating resin layer is to utilize such copper foil to which a resin insulating layer has already been attached.

Next, the surface of the copper foil 11 affixed to one main side of the aluminum substrate 2 is subjected to a screen printing process using a resist film as a mask so that a specified conductive path is left exposed, followed by a process whereby a noble metal (gold, silver, platinum) coating (omitted from the drawings) is applied. After the removal of the resist the integrated circuit substrate 2, on which the specified conductive path 19 is formed, is obtained by etching the copper foil 11 using the noble metal coating layer as a mask. The pattern boundary of the conductive path 3 from a screen printing process is 0.5 mm, but it is possible to form an extremely fine conductive path 3 with a 5 $\mu$m rule by using commonly known photolithography.

Again referring to FIG. 3 and FIG. 4, the socket 15 for connecting the non-volatile memory 4, the microcomputer 5, which receive data from the non-volatile memory 4, and its peripheral circuit elements 6, are secured to the integrated circuit substrate 2 at specified positions. The non-volatile memory 4, the microcomputer 5, and its peripheral circuit elements 6, are mutually connected by the conductive path 3. The conductive path 3 is formed so that it extends over almost the entire surface of the integrated circuit substrate 2, and a lead securing pad is formed on the part of the conductive path 3 which extends over the peripheral side section of the integrated circuit substrate 2. A plurality of external lead terminals 12, bent almost at right angles for mounting on a mounting plate (omitted from the drawings), is secured to this securing pad.

Figure 6:
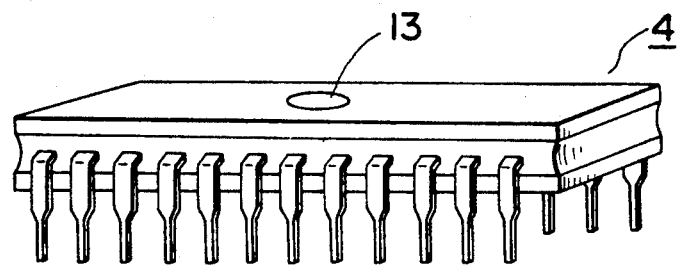
FIG. 6 and FIG. 7 are a perspective drawing and a sectional drawing respectively of a DIP-type EPROM.
Figure 7:
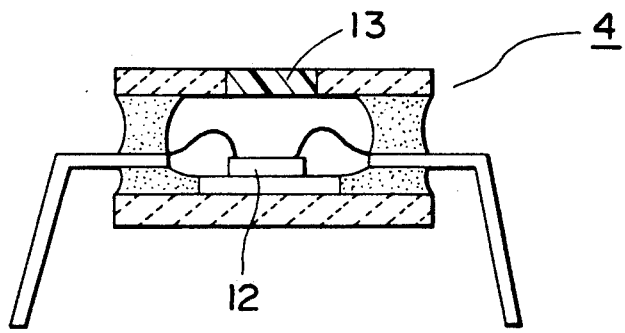
Figure 8:
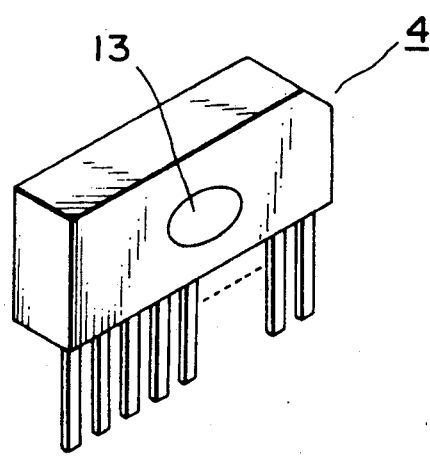
FIG. 8 and FIG. 9 are a perspective drawing and a sectional drawing respectively of a SIP-type EPROM.
Figure 9:
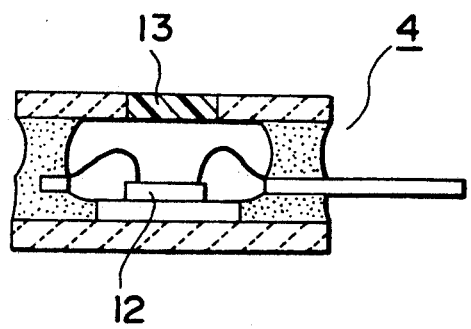

An EPROM (Erasable Programmable Read Only Memory), from which data can be erased by ultraviolet light, is used for the non-volatile memory, (hereinafter, the molded non-volatile memory will be referred to as the EPROM element; a chip-type non-volatile memory will be referred to as an EPROM chip). For the most part, a DIP (Dual-In-Line) EPROM of the type shown in FIG. 6 and FIG. 7 is provided as the EPROM element 4. In addition, a SIP (Single-In-Line) EPROM of the type shown in FIG. 8 and FIG. 9 is provided as the EPROM element 4. In all of the EPROM element 4, a light-transmitting member 13 which transmits ultraviolet light for the erasure of data is positioned on the upper section of the EPROM chip 12 as shown in FIG. 6 to FIG. 9.

Figure 3:
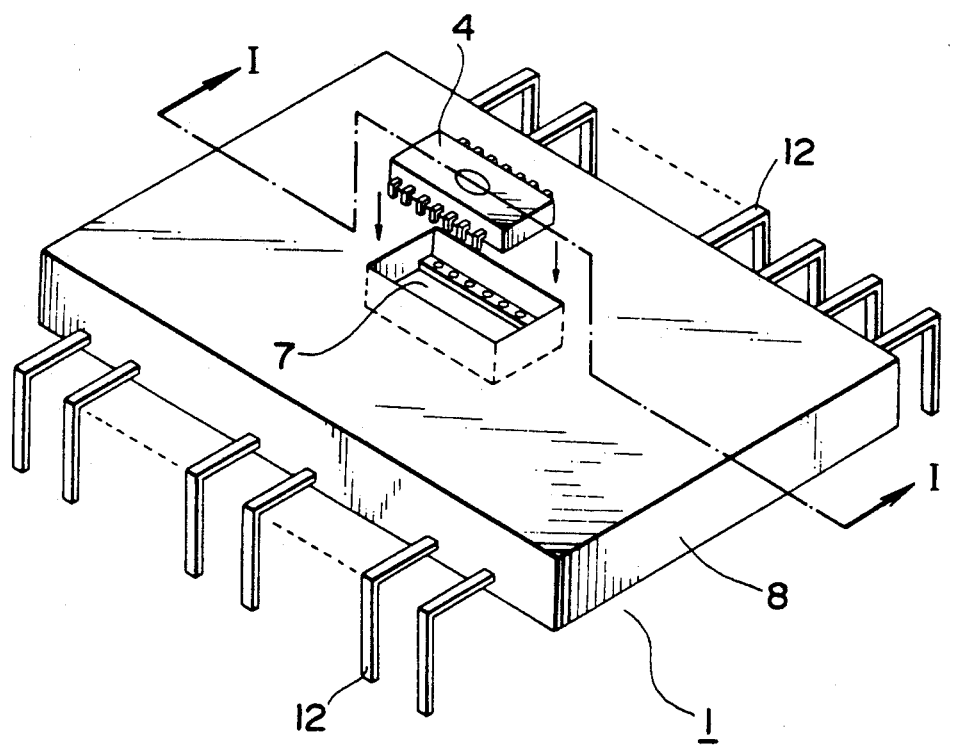
FIG. 3 is a perspective drawing of a first embodiment of the present invention.
Figure 4:
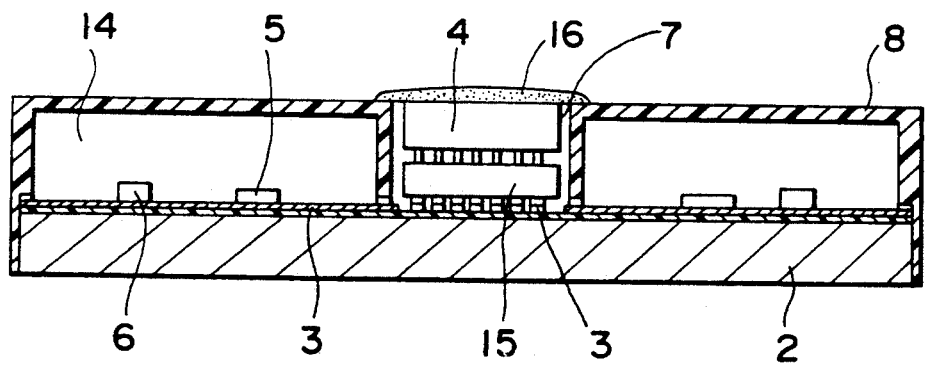
FIG. 4 is a sectional drawing viewed along the section I—I in FIG. 3.
Figure 10:
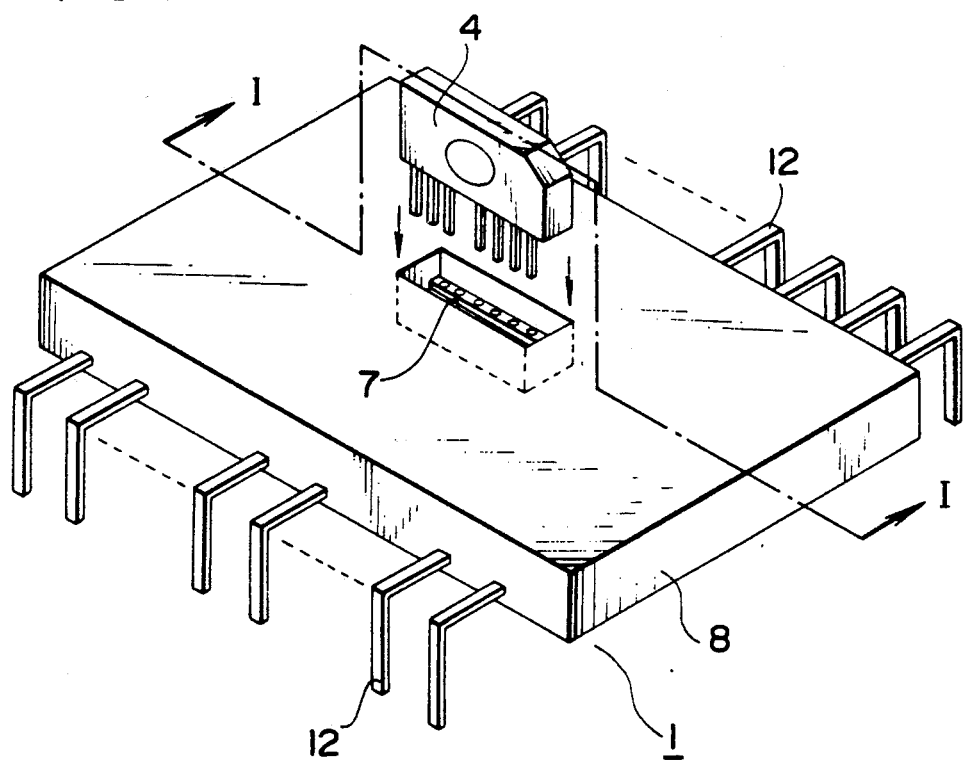
FIG. 10 is a perspective drawing showing a modification of the first embodiment of the present invention.

In FIG. 3 and FIG. 4, the hybrid integrated circuit device 1 is shown as using a DIP-type EPROM element 4 because a DIP-type EPROM is usually used. However, in this embodiment an EPROM of any configuration or shape may be optionally used. It is also possible to use the SIP-type EPROM element 4 shown in FIG. 8 and FIG. 9. FIG. 10 is a perspective drawing of an embodiment using this SIP-type EPROM element 4. Also, the parts in this drawing corresponding to the parts in the embodiment of FIG. 3 and FIG. 4 bear the same reference numbers. A further explanation of these parts is hence omitted.

The EPROM element 4 usually falls into the general classification of a resin molded package or a ceramic package, depending on the package material. Either a resin molded- or a ceramic-type EPROM element 4 can be used in the present embodiment. These types of EPROM elements are disclosed in Japanese Patent Laid-open Nos. 74358/1978 and 290160/1987.

An LCC-type EPROM or a PLCC-type EPROM can be also used in the present embodiment. The LCC- and PLCC-types of EPROM elements are fabricated to provide connecting electrodes at the bottom of the four sides of the EPROM element, and are mounted on the substrate through a socket in the same manner as in the DIP-type EPROM. When an LCC- or PLCC-type of EPROM is used, the hybrid integrated circuit device of the present invention can be made even smaller. An EPROM chip can also be used, which will be later explained in detail in modifications of the present embodiment.

Continuing the explanation with reference to FIG. 3 and FIG. 4, the microcomputer 5 to which program data from the EPROM element 4 is fed, and various elements constructing a integrated circuit, such as the peripheral circuit elements 6, a transistor, resistance chip, or condenser chip, or the like are secured in the form of a chip by soldering or by silver paste or the like to a specified conductive path 3. The microcomputer 5 and its peripheral circuit elements 6 are bonded to the conductive path 3. In addition, a carbon resistor and a nickel plated resistor (omitted from the drawings) are formed as respective resistance elements between the conductive paths 3 by screen printing.

The casing 8 is formed from an insulating thermoplastic resin in the shape of a box in order to create a space 14 between the casing 8 and the integrated circuit substrate 2 when being secured to the integrated circuit substrate 2. The peripheral end sections of the box-shaped casing 8 are positioned on the peripheral end sections of the integrated circuit substrate 2, and are firmly secured to the integrated circuit substrate 2 in an integrated manner using a seal material (J-Sheet: trademark) with adhesive characteristics. The EPROM element insertion hole 7 is formed in a specified position in the casing 8 of the present embodiment in essentially the same shape as the external shape of the EPROM 4, but slightly larger to simplify the insertion and removal of the EPROM 4. Here, in this Specification, when a EPROM element insertion hole is formed in a position relatively close to the center of the casing 8, the hole is referred to as "insertion hole", while, when a EPROM element insertion hole is formed on the peripheral of an integrated circuit substrate, the hole is referred to as "cavity". However, simply "hole" is used as a general term.

One end of each of a plurality of conductive paths 3 to which an electrode of the socket 15 is to be securely attached is formed on the area of integrated circuit substrate 2 which is exposed by the insertion hole 7 formed in the casing 8, and the socket 15 is secured to the tip section of those conductive paths 3. The other end of the conductive paths 3 to which the socket 15 is attached is efficiently routed to the vicinity of the chip-type microcomputer 5 and is electrically connected to the microcomputer 5 by bonding wire.

Figure 11:
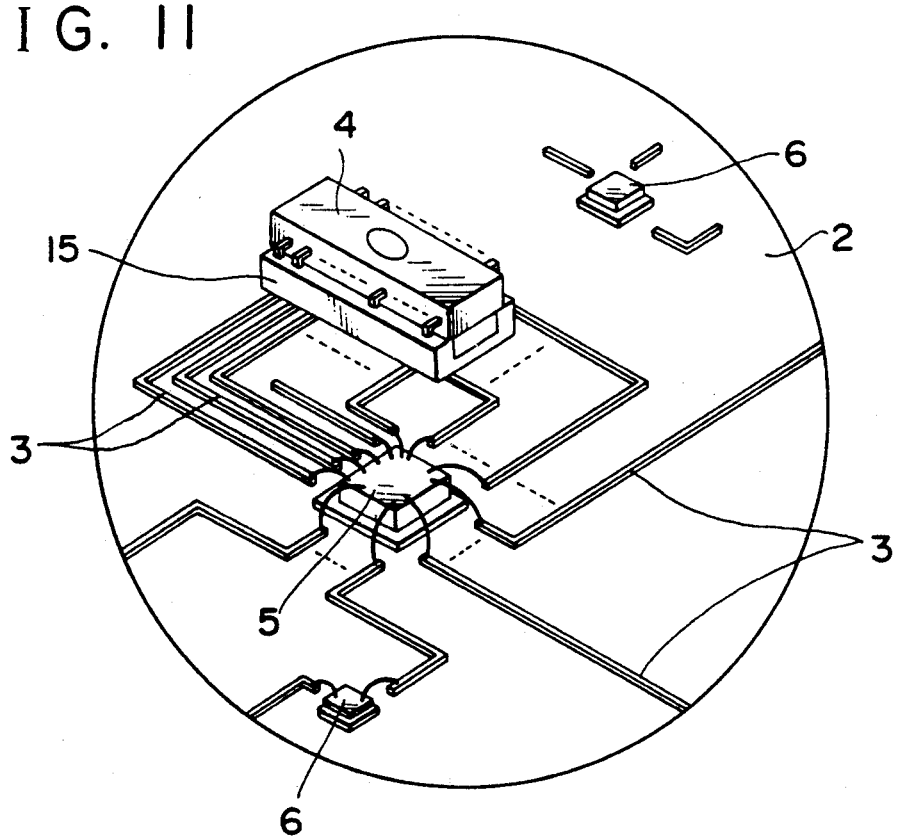
FIG. 11 is an expanded view of the first embodiment showing the area around the EPROM on the integrated circuit substrate.

The positional relationship of the EPROM element 4 and the microcomputer 5 will now be explained. FIG. 11 is an expanded drawing of the section close to the EPROM element 4 and the microcomputer 5 of the integrated circuit substrate 2.

As illustrated in FIG. 11, the EPROM element 4 and the chip-type microcomputer 5 are connected through a plurality of conductive paths 3. Therefore, the EPROM element 4 and the microcomputer 5 are positioned so that they are adjacent or are as close together as possible to shorten the routing of the conductive paths 3. By these means, the routing of the conductive paths 3 between the EPROM element 4 and the microcomputer 5 can be formed with a short distance and the mounting area on the integrated circuit substrate 2 can be effectively utilized. The EPROM element 4 and the chip-type microcomputer 5 which is positioned close to or adjacent to the EPROM element 4, as shown in FIG. 11, are connected by wire bonding to the tip section of the conductive paths 3 which extend close to the microcomputer 5 and are electrically connected to the EPROM element 4.

When the position of the EPROM element 4 on the integrated circuit substrate 2 is set in the above manner, the position of the insertion hole 7 formed in the casing 8 is also set. By suitably designing the height of the casing 8 and the height of the socket 15, when the EPROM element 4 is inserted into the socket 15, it is possible to have only the top surface of the EPROM element 4 exposed at the outside of the casing 8, specifically, to have the top surfaces of the EPROM element 4 and the casing 8 almost correspond. The hybrid integrated circuit device 1 designed in this manner has highly superior handling capabilities and reliability. In addition, the microcomputer 5 and its peripheral circuit elements 6 which are connected to the EPROM element 4, specifically, the chip-type electronic parts and all the elements such as printed resistances and plated resistances, are arranged in the sealed space 14 formed between the integrated circuit substrate 2 and the casing 8.

A light-shielding seal material 16 is attached to the upper portion of the insertion hole 7 in the casing 8 in which the EPROM element 4 has been inserted. The seal material 16 completely blocks out any light and completely seals the EPROM element 4. However, when the SIP-type EPROM element 4 is used, its light-transmitting section is embedded in the insertion hole 7 in the casing 8 so that the light-shielding seal material 16 is not necessarily required.

With this embodiment of the structure outlined above, to erase the data in the EPROM element 4, the seal material 16 is peeled off and ultraviolet light is directed onto the EPROM element 4; or the EPROM element 4 is removed from the socket 15 and exposed to ultraviolet light radiation. To rewrite into the EPROM element 4, the EPROM element 4 is usually removed from the socket 15 and a ROM writer is then used for the rewriting.

Figure 12:
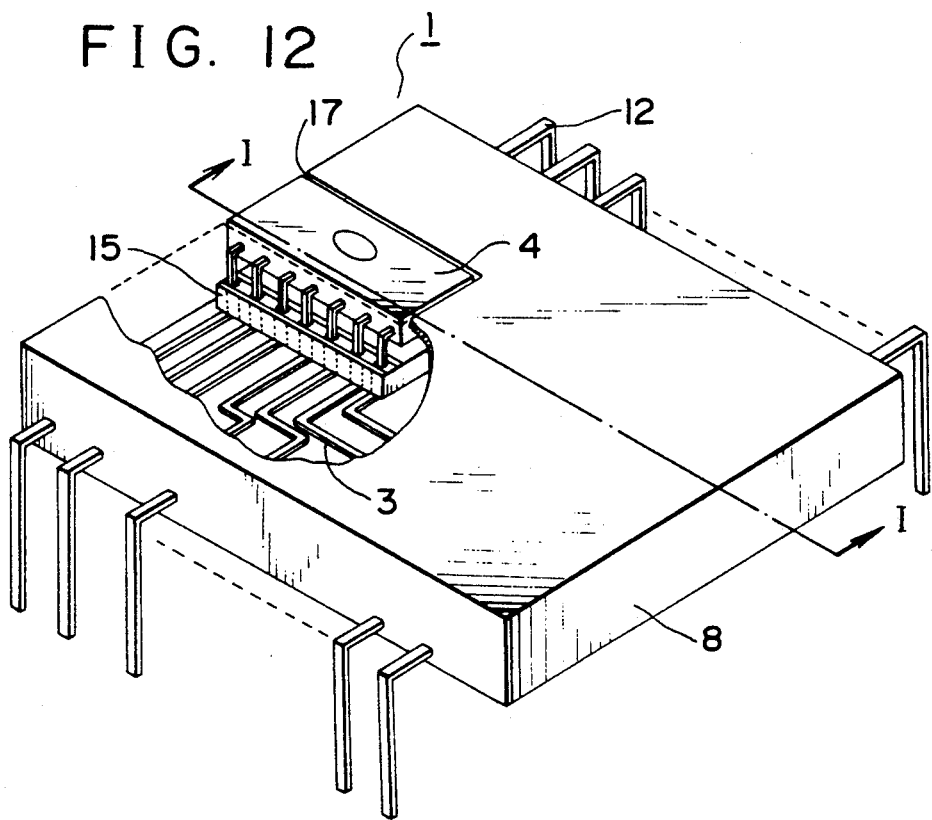
FIG. 12 and FIG. 13 are perspective drawings of other modifications of the first embodiment using a DIP-type EPROM and a SIP-type EPROM, respectively.
Figure 13:
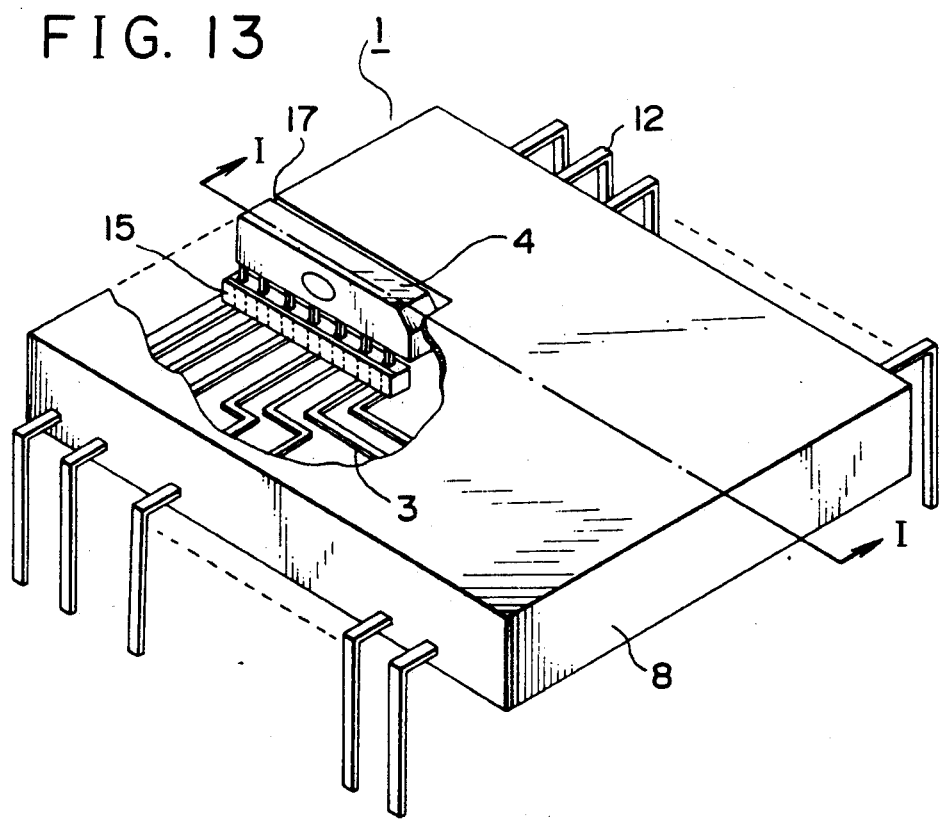
Figure 14:
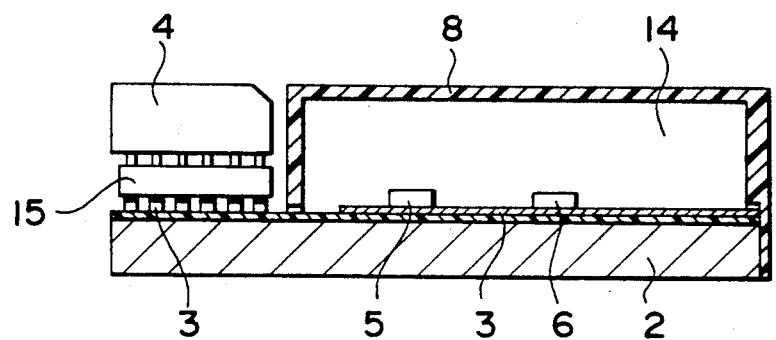
FIG. 14 is a sectional drawing viewed along the section I—I in FIGS. 12 and 13.

Next, referring to FIG. 12 to FIG. 14, modifications of the first embodiment will be explained. FIG. 12 and FIG. 13 show examples of modifications to the embodiments shown in FIG. 3 and FIG. 10. FIG. 14 is a sectional drawing, viewed along the line I—I in FIG. 12 and FIG. 13.

According to the specifications of a hybrid integrated circuit device, the position of a microcomputer mounted on the device usually varies with each hybrid integrate circuit device. Accordingly, the position on the casing 8 of the EPROM element 4 which is to be placed adjacent to the microcomputer 5 also varies according to the specifications of the hybrid integrated circuit device. In the examples of modifications shown in FIG. 12 to FIG. 14, hybrid integrated circuit devices 1 are illustrated which have the EPROM element 4 positioned at the end of the casing 8 as a result of the above-mentioned circumstances. The difference between the previous embodiment shown in FIG. 3 and the embodiment shown in FIG. 10 is limited to the fact that in the previous embodiment the insertion hole 7 for insertion of the EPROM element 4 is formed in a position relatively close to the center of the casing 8, while, in the modification, the cavity 17 which corresponds to the insertion hole 7 is formed at the periphery of the casing 8. Accordingly, for the other parts of FIG. 12 to FIG. 14 which correspond respectively to the parts in FIG. 3, FIG. 4, and FIG. 10, the identical reference numbers are attached, so further explanation is omitted.

A further modification of the first embodiment will now be explained with reference to FIG. 15 to FIG. 20.

In this modification, an EPROM chip 4 is used instead of the EPROM element 4. The structures of the integrated circuit substrate 2 and the casing 8 are identical to the previously explained embodiment. Accordingly, in FIG. 15 to FIG. 20, the same reference numbers are used for these parts as in the previous embodiment.

Figure 15:
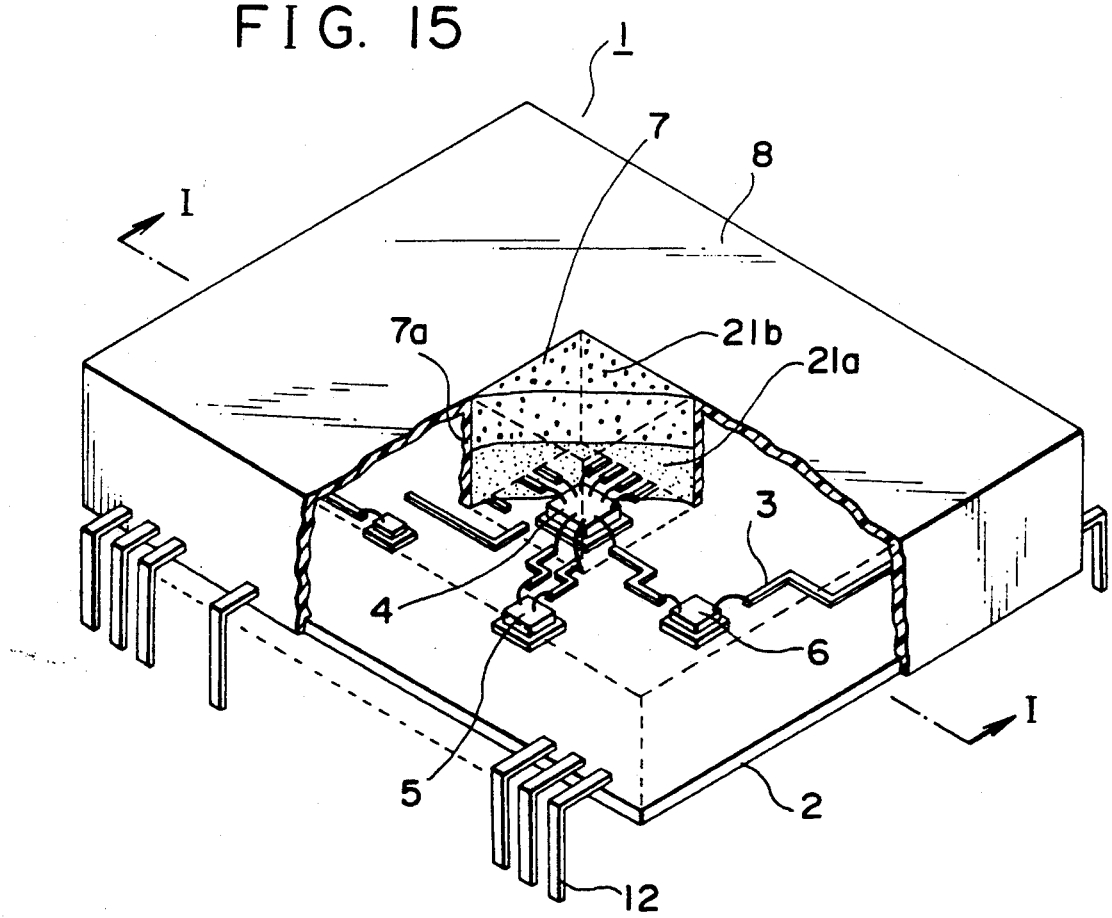
FIG. 15 is a perspective drawing showing a modification of the first embodiment of the present invention.
Figure 16:
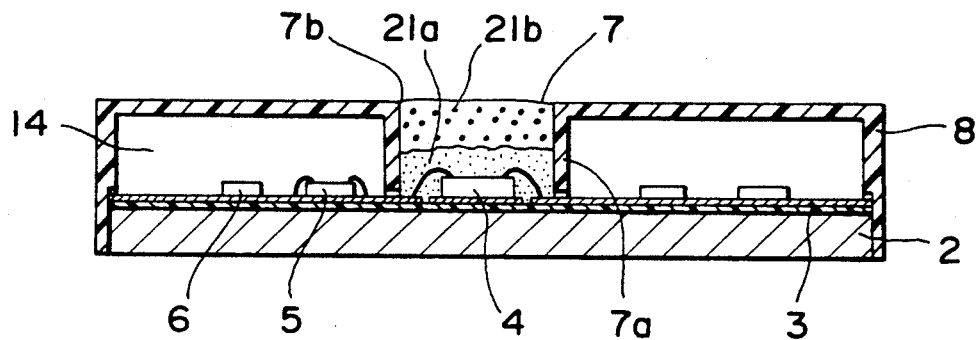
FIG. 16 and FIG. 17 are sectional drawings viewed along the section I—I in FIG. 15 showing different cover structures for an EPROM chip respectively.
Figure 17:
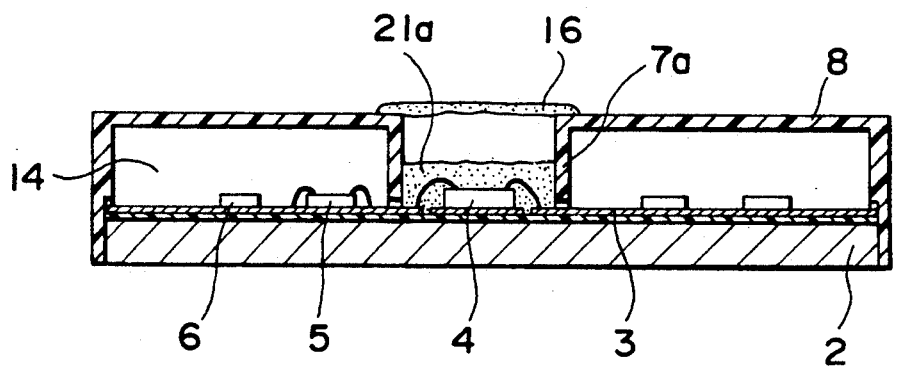

Now referring to FIG. 15 to FIG. 17, the EPROM chip 4 is a commercially available unit, and is secured to a position adjacent to the microcomputer 5 on the integrated circuit substrate 2 with a plastic material such as silver paste or solder. One end of each of a plurality of conductive paths 3 is formed close to the EPROM chip 4 and is ultrasonically bonded to the electrode of the EPROM chip 4 using bonding wires such as aluminium wire or the like. The other ends of the conductive paths 3 which are bonded to the EPROM chip 4 are routed to the vicinity of the microcomputer 5 with good efficiency and are ultrasonically bonded to the chip-type microcomputer 5, also using aluminum wire.

The casing 8 made from an insulating thermoplastic resin is formed in almost a box shape to form the space section 14 between the integrated circuit substrate 2 and the casing 8, when the casing 8 is secured to the integrated circuit substrate 2. In addition, the hole 7 is formed so as to expose the EPROM chip 4 and one end of each of the conductive paths 3 which are ultrasonically bonded to the electrode of the EPROM chip 4. By these means, when the casing 8 is firmly secured to the integrated circuit substrate 2 by means of seal material and is integrally formed, the microcomputer 5 and its peripheral circuit elements 6, and the other chip parts which are integrated circuits, are sealed in the space 14 between the integrated circuit substrate 2 and the casing 8. The EPROM chip 4, one end of the conductive paths 3, and the bonding wire which is connected to the electrode of the EPROM chip 4 and to one end of the conductive paths 3 are exposed on the integrated circuit substrate 2, and the perimeter is enclosed by a wall body 7a forming the hole 7.

One or more layers of resin are filled into a space 7b enclosed by the wall body 7a. The EPROM chip 4 and the bonding wire are completely covered by this resin. A UV light-transmitting resin 21a is used for the resin of the first layer which directly covers the EPROM chip 4, so that the data on the EPROM chip 4 can be erased by ultraviolet light. Any non-aromatic-type resin, for example, a methyltype silicon rubber or silicon gel, can be used as the UV light-transmitting resin 21a.

Now referring to FIG. 16, in this example a second layer of resin 21b is filled onto the first layer of the UV light-transmitting resin 21a. As this second resin layer 21b, a non-UV light transmitting layer is used which shields out the ultraviolet light to prevent erroneous erasure of the data stored on EPROM chip 4. There are no restrictions as to the non-UV light transmitting layer 21b used, providing it contains an aromatic ring (benzene ring). For example, an epoxy resin or polyimide resin which contains an aromatic ring (benzene ring) is used and filled in until its surface almost corresponds with the top surface of the casing 8.

As an alternative, the light-shielding material 16 is used in place of the non-UV light transmitting layer 21b. The same effect can be expected when the seal material 16 is applied on the hole 7 in the casing 8.

Figure 18:
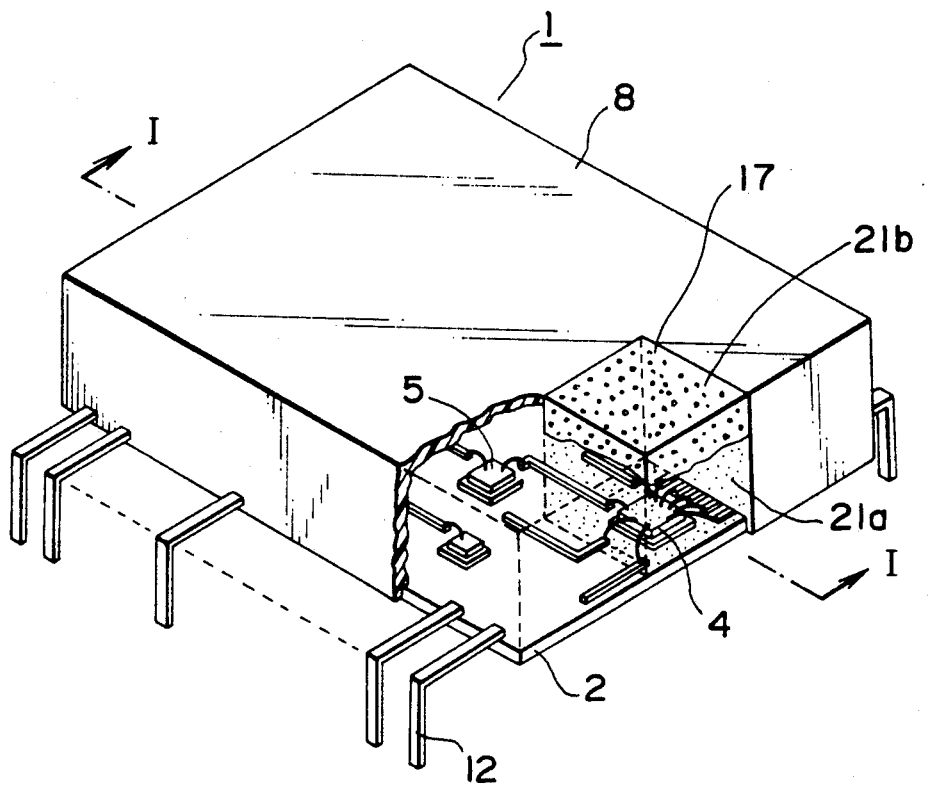
FIG. 18 is a perspective drawing of a further modification of the first embodiment.
Figure 19:
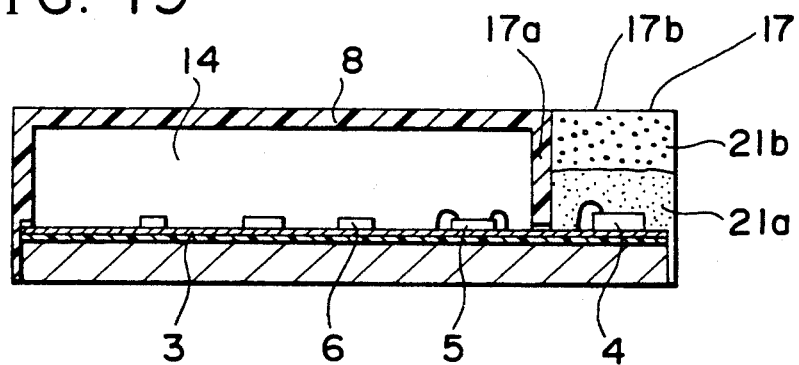
FIG. 19 and FIG. 20 are sectional drawings viewed along the section I—I in FIG. 18 showing different cover structures for the EPROM chip respectively.
Figure 20:
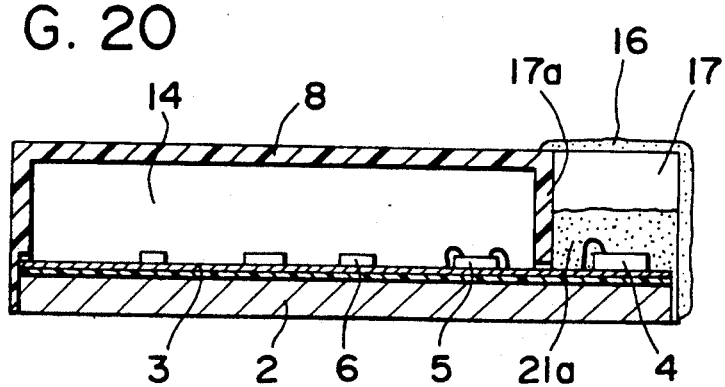

As was previously explained, the position of the microcomputer is changed according to the specifications of the hybrid integrated circuit device, and the position on the casing 8 of the EPROM element 4 which should be positioned adjacent to the microcomputer 5 is also changed. In this modification using the EPROM chip 4, correspondence with the specifications is possible so that the EPROM chip 4 is positioned relatively close to the periphery of the integrated circuit substrate 2. FIG. 18 to FIG. 20 show this type of modification. The only difference between this example and the previous example shown in FIG. 15 to FIG. 17 is that in the previous example the hole 7 for the EPROM chip 4 was formed relatively close to the center of the casing 8, while in this modification the cavity 17 which corresponds to the hole 7 is formed at the periphery of the casing 8. Accordingly, for the other parts of FIG. 18 to FIG. 20 which correspond respectively to the parts in FIG. 15 to FIG. 17, the identical reference numbers are attached, so further explanation is omitted.

In the above modifications, the data on the EPROM chip 4 is erased by stripping off the non-UV light transmitting resin 21b or the seal material 16, then directing ultraviolet light onto the EPROM chip 4. Rewriting is accomplished by stripping the UV light transmitting resin 21a from the EPROM chip 4, then contacting the conductive path 3 connected to the electrode of the EPROM chip 4 with the terminal of a probe and the like, and writing in data from a write-in device. Because the adhesive strength of the UV light transmitting resin 21a is low there is no concern about breakage of the bonding wire during this stripping procedure.

A second embodiment of the present invention will now be explained with reference to FIG. 21 to FIG. 23.

Figure 21:
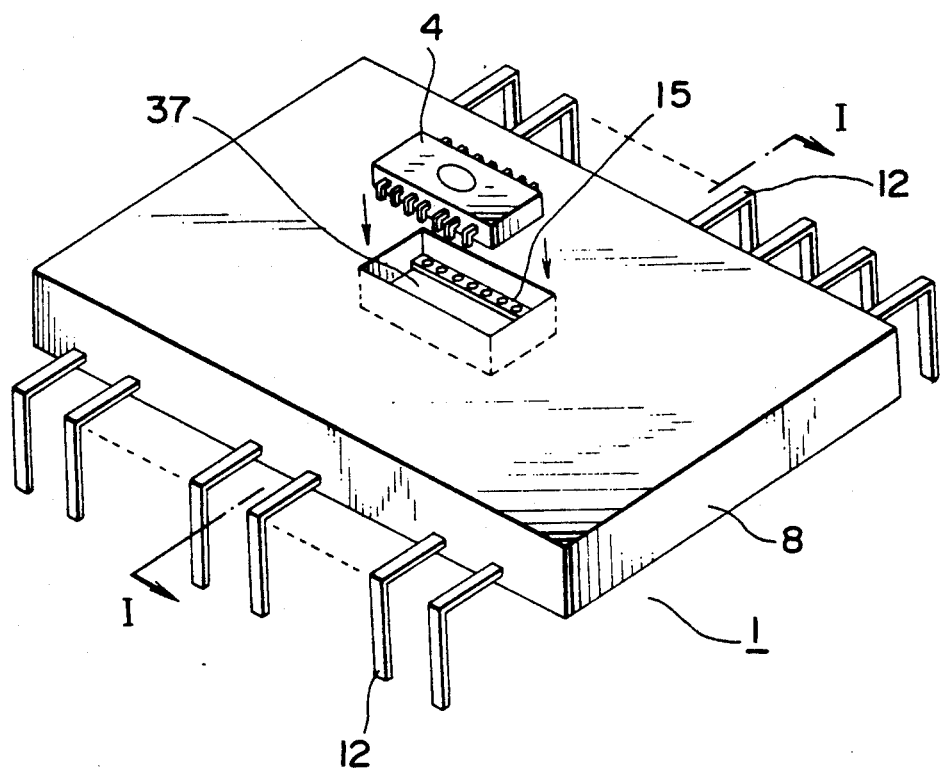
FIG. 21, FIG. 22 and FIG. 23 are drawings showing a second embodiment of the present invention.

Now referring to FIG. 21, the external shape of the present embodiment is exactly the same as that of the embodiment shown in FIG. 3. A structure is provided in which a DIP-type or other optional type of EPROM element 4 is inserted into an indentation 37 in the upper side of the hybrid integrated circuit device 1.

Figure 22:
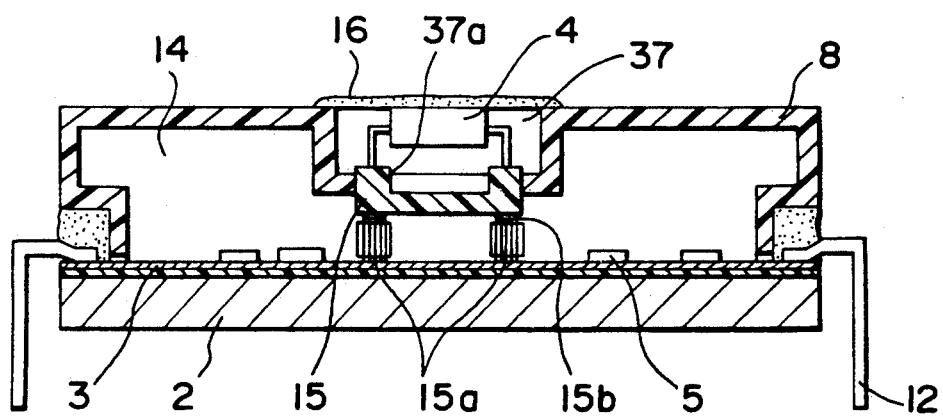

The features of the present embodiment are more clearly illustrated in FIG. 22 which is a sectional view along the section I—I in FIG. 21. The casing 8 is made from a thermoplastic resin with insulating capabilities. It is formed in a box shape to create the space 14 between the casing 8 and the integrated circuit substrate, when the casing 8 is integrally formed with the integrated circuit substrate 2. In addition, the indentation 37 into which the EPROM element 4 is inserted is formed in a specified position of the casing 8, and the upper half of the socket 15 which is provided in the shape like supports on geta is embedded in the bottom of the indentation 37. This type of structure can be prepared by integrally forming the socket 15 when the casing 8 is formed, or by forming a hole 37a as the upper half of the socket 15 at the bottom of the indentation 37 and hermetically sealing the half of the socket 15. In this case, the sealed section is sealed by an adhesive resin, as required. The EPROM element 4 and the microcomputer 5 are connected through the socket 15 by a connector 15a which is explained in the following.

Figure 23:
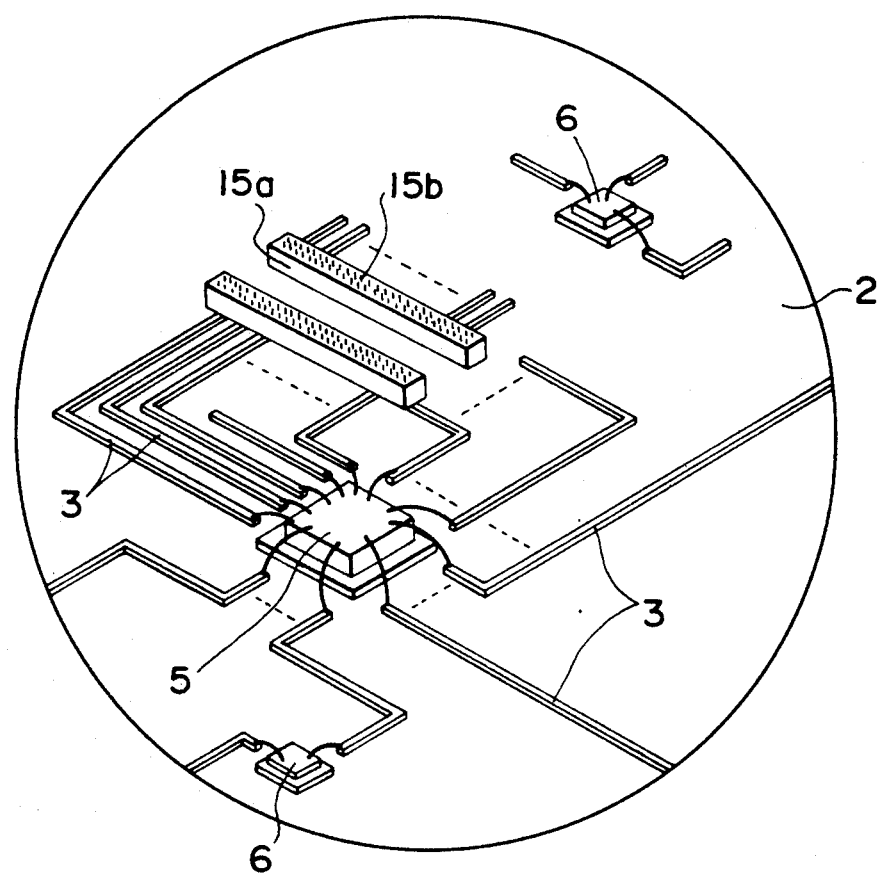

The shape of the connector 15a is clearly shown in FIG. 23. This structure is formed in a plate-shape from a rubber with elastic energy or a synthetic resin wherein a plurality of filamentary conductors 15b are embedded. The filamentary conductor 15b projects in the vertical direction (in the drawing) from the connector 15a. The connector 15a, as shown in FIG. 23, is secured in advance with solder to a specified conductive path 3 formed at a position adjacent to the microcomputer 5 on the integrated circuit substrate 2. This type of connector 15a is disclosed in Japanese Patent Laid-open Nos. 229714/1987 and 58079/1984.

Figure 24:
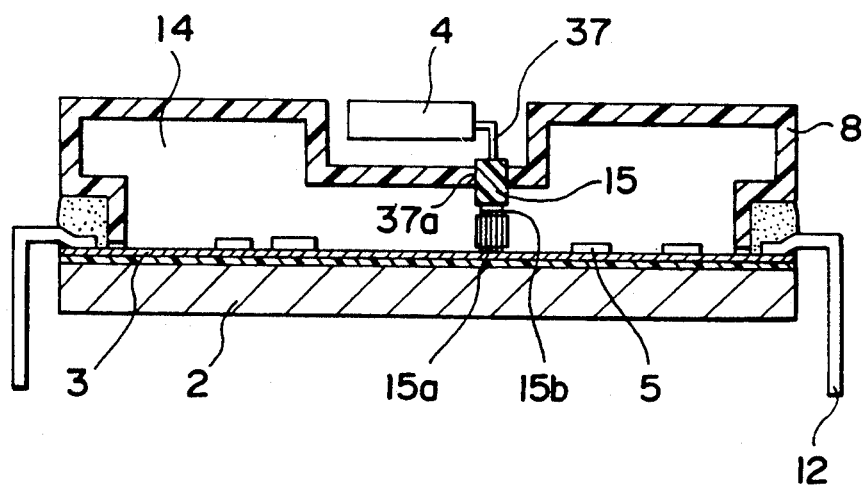
FIG. 24 is a sectional drawing of the second embodiment using SIP-type EPROM.

With this embodiment, the conductive path 3 can be formed between two connectors 15a, improving the mounting efficiency of the integrated circuit substrate 2. In this embodiment, a SIP-type EPROM element can also be used as shown in FIG. 24 which is a sectional drawing corresponding to FIG. 22. When a SIP-type EPROM is used, the UV-light shielding seal material 16 can be omitted by positioning the light-transmitting member 13 is placed vis-a-vis the surface of the casing 8.

Here, before explaining the other embodiments of the present invention, in order to improve understanding of the present invention, an explanation will be given of the hybrid integrated circuit device of the present invention which was applied in a MODEM for data transmission via telephone circuits from the data terminal of a computer system or the like.

Figure 25:
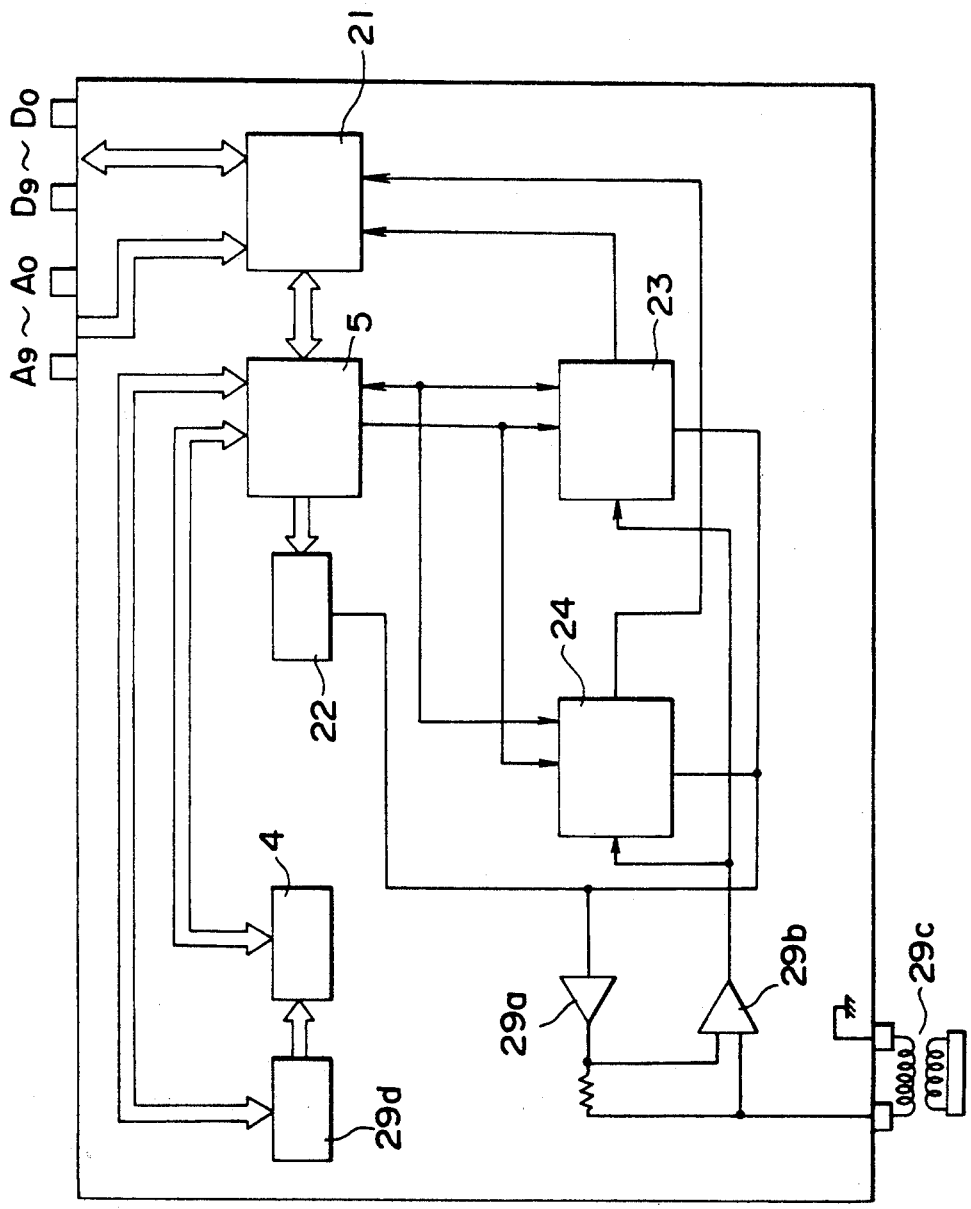
FIG. 25 to FIG. 28 are explanatory drawings of a hybrid integrated circuit device of the present invention suitable for use in a MODEM.

Now referring to FIG. 25, which shows a block diagram with the MODEM mounted on the integrated circuit substrate 2, the MODEM comprises a DTE interface 21 which stores, in its built-in memory, data transmitted from a computer system and outputs the data; the microcomputer 5 which outputs a specified output signal according to the data output from the DTE interface 21; the EPROM 4 which is accessed from the microcomputer 5; a first and second modulator-demodulator circuits 22, 23 which modulate and demodulate the output signals from the microcomputer 5 and output them to an NCU (Network Control Unit, omitted from the drawings); and a DTMF generator 24 which generates a desired DTMF signal (tone signal) corresponding to the output signal from the microcomputer 5.

An integrated circuit such as, for example, an STC9610 (manufactured by Seiko-Epson) is used for the DTE interface 21. Now referring to FIG. 26 which is a block diagram of this type of DTE interface 21, the DTE interface 21 comprises a transmission memory section 25 which temporarily stores the output signal from the computer system 28 in its built-in memory and outputs it to the microcomputer 5; a reception memory section 26 which stores the output signal from the microcomputer 5 in its built-in memory and outputs it to the computer system 28; and a control section 27 which switches the various input/output signals via the transmission memory section 25 and the reception memory section 26, and has the specific function of connecting the computer system 28 and the microcomputer 5.

Figure 27:
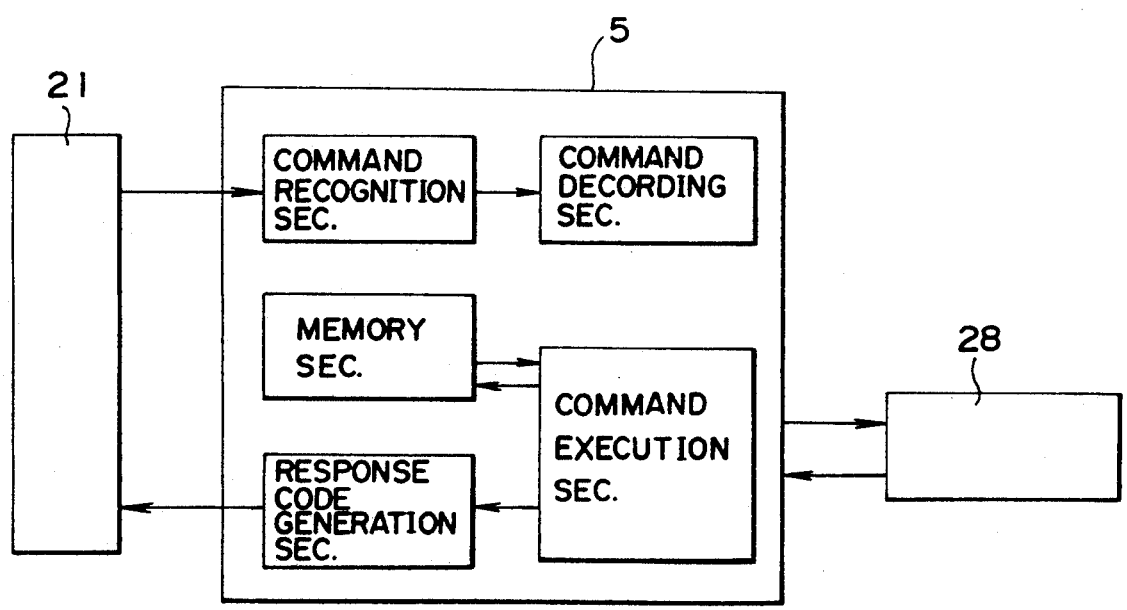

An integrated circuit such as, for example, an STC9620 (manufactured by Seiko-Epson) is used for the microcomputer 5. Now referring to FIG. 27 which is a block diagram of the microcomputer 5, the microcomputer 5 comprises a command recognition section for the recognition of signals output from the DTE interface 21; a command decoding section which decodes the output signals recognized by the command recognition section; a command execution section which compares the data in the memory section according to the signal decoded in the command decoding section and feeds the data to the modulator-demodulator circuits 22, 23; a response code generation section which compares the data in the command decoding section with the data in the memory section and outputs a signal to the DTE interface 21 when erroneous data is fed to the command execution section.

Again referring to FIG. 25, the modulator-demodulator circuits 22, 23 convert a digital signal transmitted from the microcomputer 5 to an analog signal and transmits it to the NCU section (omitted from the drawings), and, conversely, converts an analog signal transmitted from the NCU section to a digital signal and transmits it to the microcomputer 5. The modulator-demodulator circuits 22, 23 are provided with both of a low speed circuit and a medium speed circuit. The first modulator-demodulator circuit 22 is a low speed, 300 bps circuit, and the second modulator-demodulator circuit 23 is a medium speed, 1200 bps circuit. The microcomputer 5 selects one of the first or second modulator-demodulator circuits 22, 23. The DTMF generator 24, by inputting the data output from the command execution section of the microcomputer 5 to the respective COL, ROW input terminals, outputs a specific DTMF signal to a transmission AMP 29a to output the signal to the telephone circuits.

Program data for setting the various kinds of modes of the MODEM is stored in memory in the EPROM 4. This data is fed to the microcomputer 5 according to an address indicated by the microcomputer 5.

Figure 26:
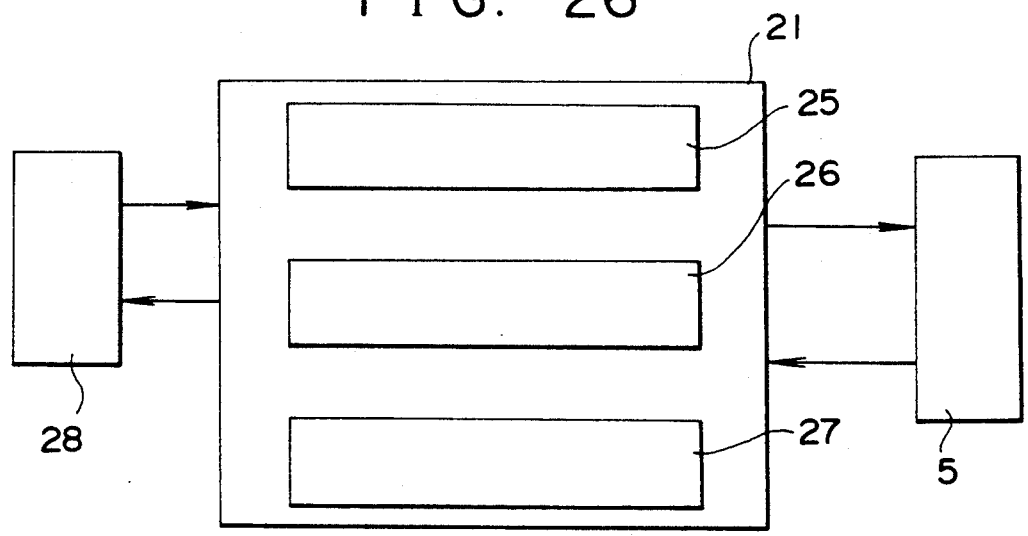

Next, the behavior of a MODEM will be briefly explained with reference to FIG. 25 and FIG. 26. On the commencement of data communication, a MODEM is subjected to test according to the following procedures. A control switch 29d is activated by a read signal from the microcomputer 5. Specific address data is fed to the EPROM 4 and the program data in the EPROM 4 is fed to the microcomputer 5 according to this address data. A check is made to confirm that the various modes, such as the communication standards (Bell/-CCITT standards) of the MODEM which carries out the communications, the communication speeds (300/1200 bps), format correspondence, and the DIP switch switching modes are in agreement.

When these modes are in agreement the telephone number of the MODEM of the response side computer system is keyed in and this telephone number is input to the DTE interface 21 used as the interface with the computer system 28. This telephone number is also transmitted to the microcomputer 5 for decoding. The result decoded by the microcomputer 5 is transmitted to the DTMF generator 24. The DTMF signal of the DTMF generator 24 is transmitted to the ordinary telephone circuits through a transmission amplifier 29a and a line transformer 29c.

The transmitted DMTF signal sends out a CALL signal to the response side MODEM. The response side receives and automatically accepts the CALL signal. By the above procedures, the response side MODEM transmits an answer tone to the call side MODEM, that is, the hybrid integrated circuit device 1 of the present invention.

The call side MODEM determines whether or not the answer tone is the specified answer tone to the call side MODEM. If the correct answer tone has been received this MODEM enters communication status.

On entering communication status, the call side parallel data according to a specific keyed input signal, through a keyboard (omitted from the drawings) at the call side microcomputer 5 is input to the DTE interface 21. This data is also transmitted to the microcomputer 5. Next, the parallel data is converted to serial data and is transmitted to the low speed modulator-demodulator circuit 22. Here, the digital signal is converted to an analog signal and undergoes frequency modulation (FSK) based on the communication standards, and is transmitted to the response side MODEM via transmission amplifier 29a and the line transformer 29c.

The frequency modulated analog signal according to the keyed input signal from the response side computer system 28 is transmitted to the call side MODEM and is input to the low speed modulator-demodulator circuit 22 through the line transformer 29c an a receiving amplifier 29b. Here, the analog signal is converted to a digital signal and is input to the DTE interface 21, then the serial digital signal is converted to parallel digital signal in the DTE interface 21 and is input to the call side microcomputer 5. This results in the establishment of full duplex communication between the call side microcomputer 5 and the response side computer system 28.

Figure 28:
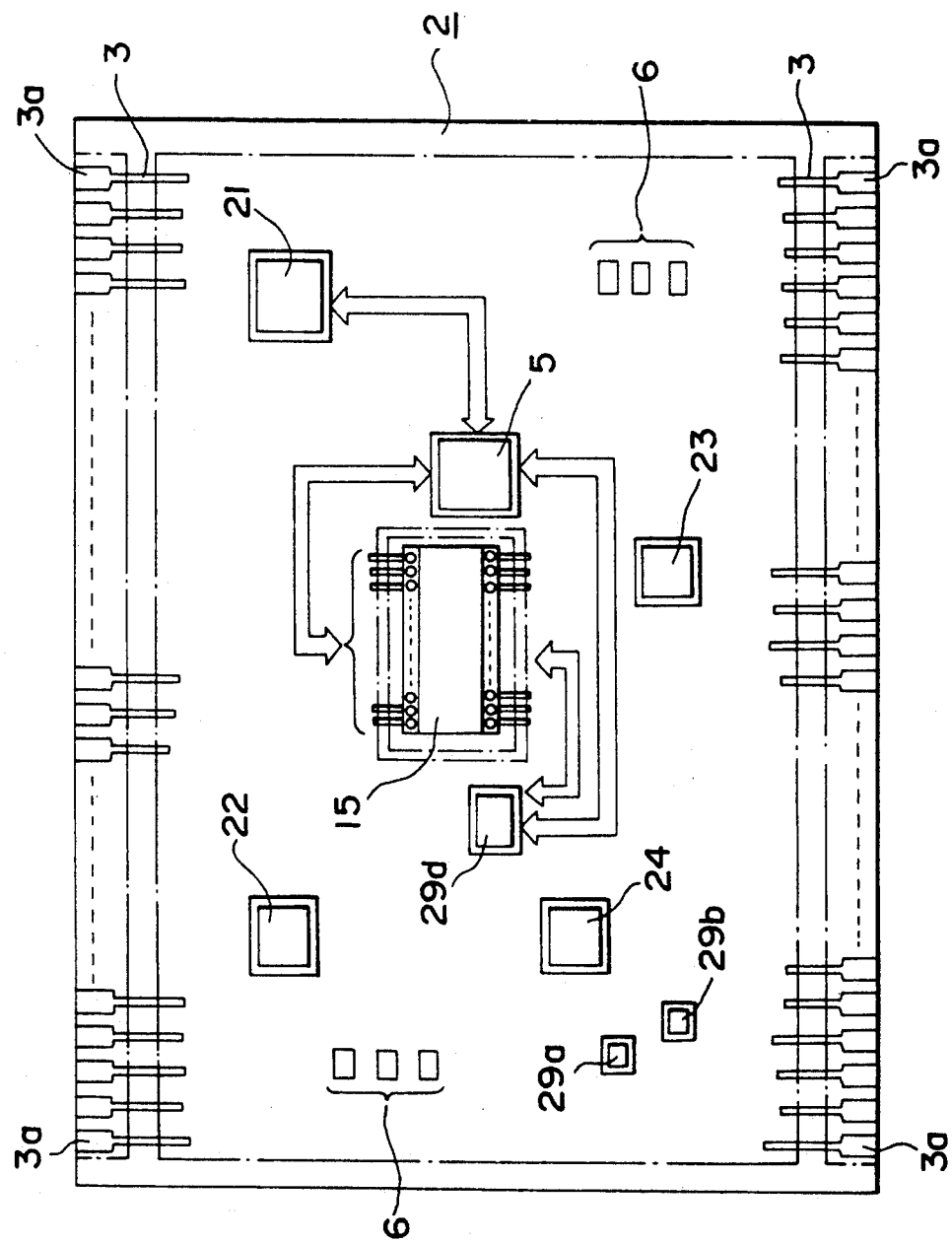

FIG. 28 is a plan drawing of the integrated circuit substrate 2 for a MODEM shown in the block diagram of FIG. 25. The reference numbers used for the circuit elements are the same as those used in FIG. 25. The EPROM 4 and the microcomputer 5 are connected via a bus line. To avoid confusion, the conductive paths which connect a plurality of the circuit elements are omitted from the drawing.

As shown in FIG. 28, a plurality of securing pads 3a are formed on both sides of the peripheral end section on the integrated circuit substrate 2 to secure the external lead terminals 12. The socket 15 on which the EPROM element 4 (omitted from the drawings) is to be mounted is secured at a specified position on the conductive paths 3 which extend from the securing pad 3a. Except for the EPROM element 4, the microcomputer 5, the DTE interface 21, the first and second modulator-demodulator circuits 22, 23, the DTMF generator 24, the control switch 29d which controls the EPROM element 4, and circuits elements of the chip parts 6, e.g. condensers, are secured to the integrated circuit substrate 2 without using sockets.

The socket 15 for the EPROM element 4 is arranged in a position close to or adjacent to the microcomputer 5. Therefore, the bus line between the microcomputer 5 and the EPROM element 4, or, more specifically, the length of the routing of the conductive path 3 can be set at the minimum distance to provide a high density mounting. The region enclosed by the dashed line is the region which is secured to the casing 8 by the adhesive sheet.

The EPROM 4 for the hybrid integrated circuit device used in the MODEM described above can be provided commercially with a wide variety of specifications. The specifications can be easily modified to satisfy the requirements of the intended user, such as various modifications for destination, various types of dealing, e.g. OEM, in-house sales, and the like. When a hybrid integrated circuit device is only designed based on the specifications of the specific user, it does not cope with other users specifications occasionally. Conventionally, it is necessary to revise the design of the hybrid integrated circuit device. However, with an embodiment in which the EPROM element 4 is installed on the substrate 2 through the socket 15, the installation and removal of the EPROM 4 is easily accomplished. It is therefore possible that the embodiment of this invention satisfy a wide variety of specifications required by customers who may simply select and mount an EPROM. In addition, even with an embodiment which uses the EPROM chip 4, it is possible to satisfy a wide variety of user specifications as before because the convenience of erasure and rewriting of the data on the EPROM chip is provided.

As shown in the above detailed explanation, first, the present embodiment has the advantage of being able to optionally select the mounting position of the EPROM 4, because the EPROM 4 is connected to the conductive path 3 on the IC substrate 2 through the insertion hole 7, cavity 17, or indentation 37 provided in a prescribed position of the casing 8. Considering the electrical connections to the built-in microcomputer it is possible to connect the EPRO 4 and the microcomputer 5 with a high degree of efficiency. In further detail, the microcomputer 5 having the closest relationship with the EPROM 4 can be positioned in a position adjacent to the EPROM 4. It is possible to provide a data line of minimum length or simplest design for transferring data between the EPROM 4 and the microcomputer 5. Loss of mounting density due to the routing of the data line can be minimized.

Second, because the EPROM element 4 is positioned in the insertion hole 7, cavity 17, or indentation 37 of the casing 8, even when using a molded-type EPROM element 4 which is available on the market, there is the advantage of dealing with a small, integrated hybrid IC device. In addition, when the EPROM chip 4 is used, an even smaller hybrid integrated circuit device can be provided. Furthermore, the necessity for a conventional printed board is abolished because the mounting density of the microcomputer and its peripheral circuit elements incorporated in the IC substrate 2 is improved, and therefore a compact hybrid integrated circuit device with a built-in and detachable EPROM element 4 can be attained.

Third, by using a metal substrate as the IC substrate 2 the heat dissipation effect is vastly improved in comparison with a printed board, contributing to a further improvement in mounting density. In addition, because the copper foil 11 is used in the conductive paths 3, the resistance value of the conductive path 3 can be considerably reduced in comparison with a conductive path where conductive paste is used. This provides more mounted circuits than with a printed board.

Fourth, various types of commercially available EPROM elements or EPROM chips 4 can be used as the EPROM 4, giving the advantage of being able to mount the EPROM 4 on the hybrid integrated circuit device with extreme ease. Further, by making the shape of the insertion hole 7, cavity 17, or indentation 37 the same as the external shape of the EPROM element 4, the EPROM element 4 can be perfectly embedded in the casing 8 to provide a hybrid integrated circuit device with a built-in EPROM of superior handling capabilities and reliability.

Fifth, because the microcomputer 5 connected to the EPROM 4 and the peripheral circuit elements 6 are incorporated in a die- or chip-form into the sealed space 14 formed by the casing 8 and the IC substrate 2, the area occupied is very small in comparison with that of a resin molded type such as a conventional printed board. This gives the advantage of a considerable improvement in mounting density.

Sixth, by having the peripheral ends of the casing 8 and of the IC substrate 2 essentially correspond, almost the entire surface of the IC substrate 2 can be utilized as the sealed space 14 so that an extremely compact hybrid integrated circuit device can be attained along with improved mounting density.

Seventh, by providing the socket 15 in a position on the IC substrate 2 which corresponds to the insertion hole 7, cavity 17, or indentation 37, the EPROM element 4 can detachably be mounted, giving the advantage of free interchangeability as well as erasure and rewriting capabilities for the EPROM element 4.

Eighth, because the upper surfaces of the casing 8 and the EPROM element 4 correspond, the advantage of a hybrid integrated circuit device with a level upper surface is realized. In addition, provision of the seal material 16 makes it possible to shield the EPROM 4 from light. This also gives the advantage of being able to seal the opening between the EPROM 4 and the casing 8.

Ninth, because the external lead terminal 12 can be protruded out of one side and/or the opposite side of the integrated circuit substrate 2, a hybrid integrated circuit device with an extremely large number of pins can be obtained.

Figure 29:
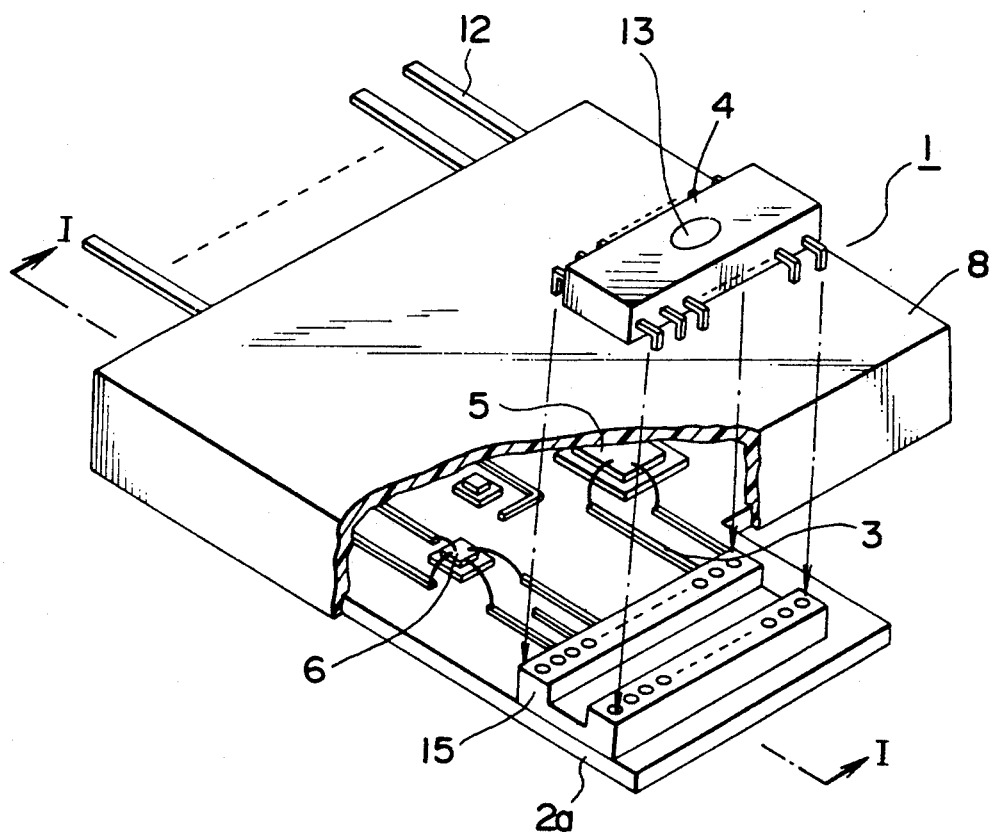
FIG. 29, FIG. 30 and FIG. 31 are drawings showing a third embodiment of the present invention.
Figure 30:
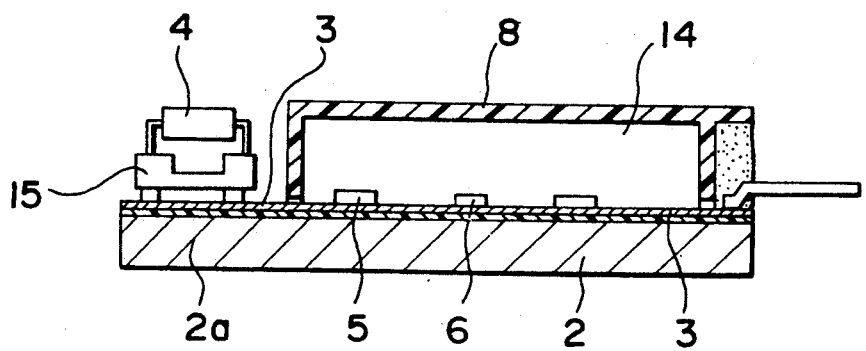
Figure 31:
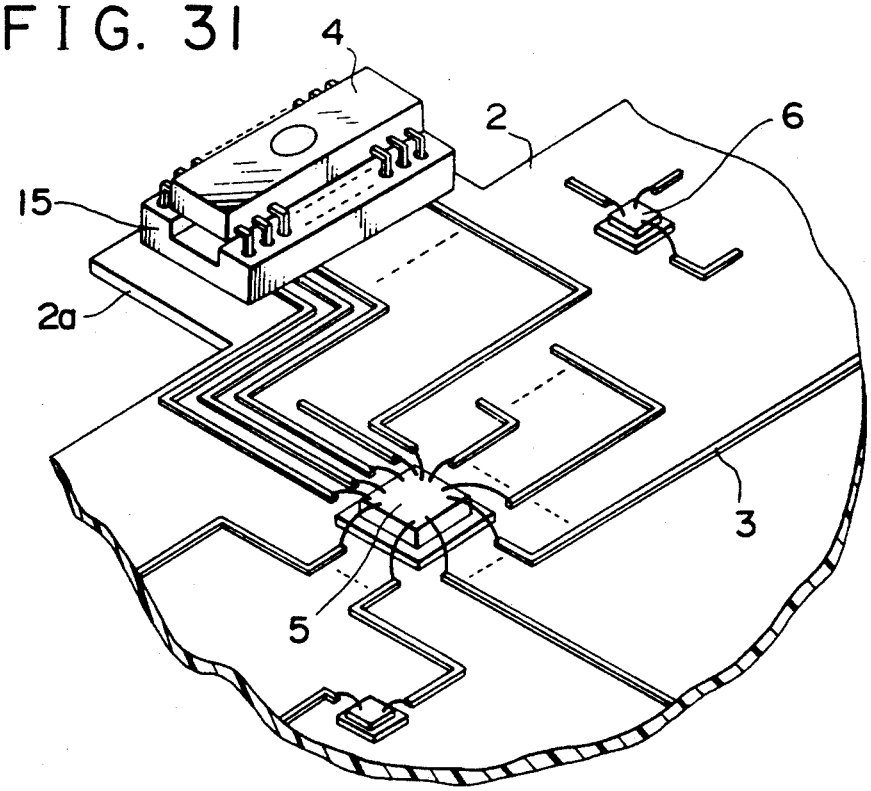
Figure 32:
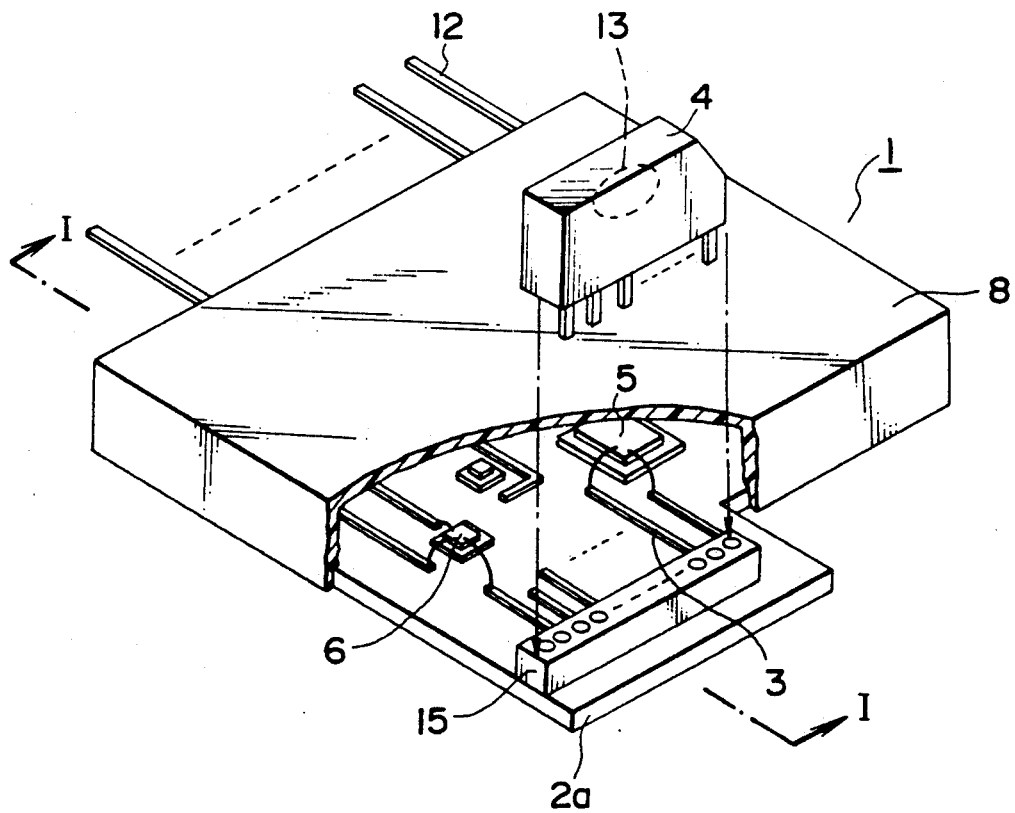
FIG. 32 to FIG. 34 are drawings showing modifications of the third embodiment of the present invention.
Figure 33:
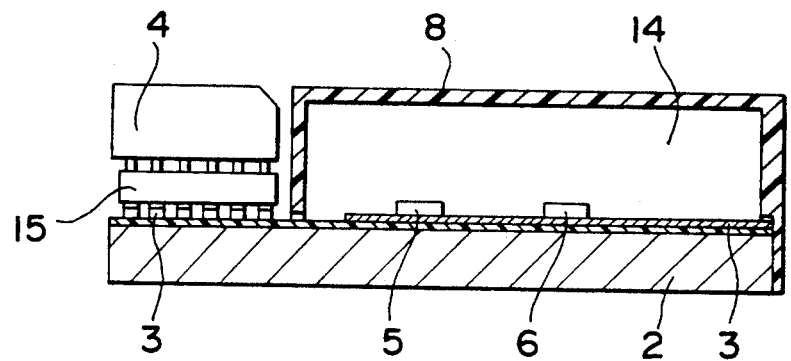
Figure 34:
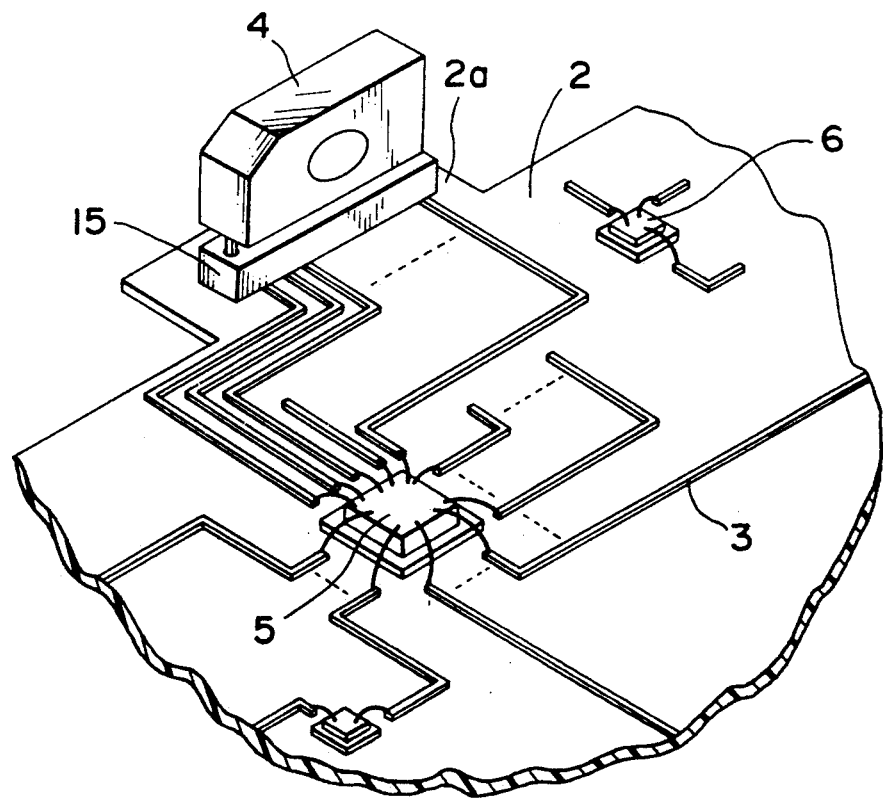
Figure 35:
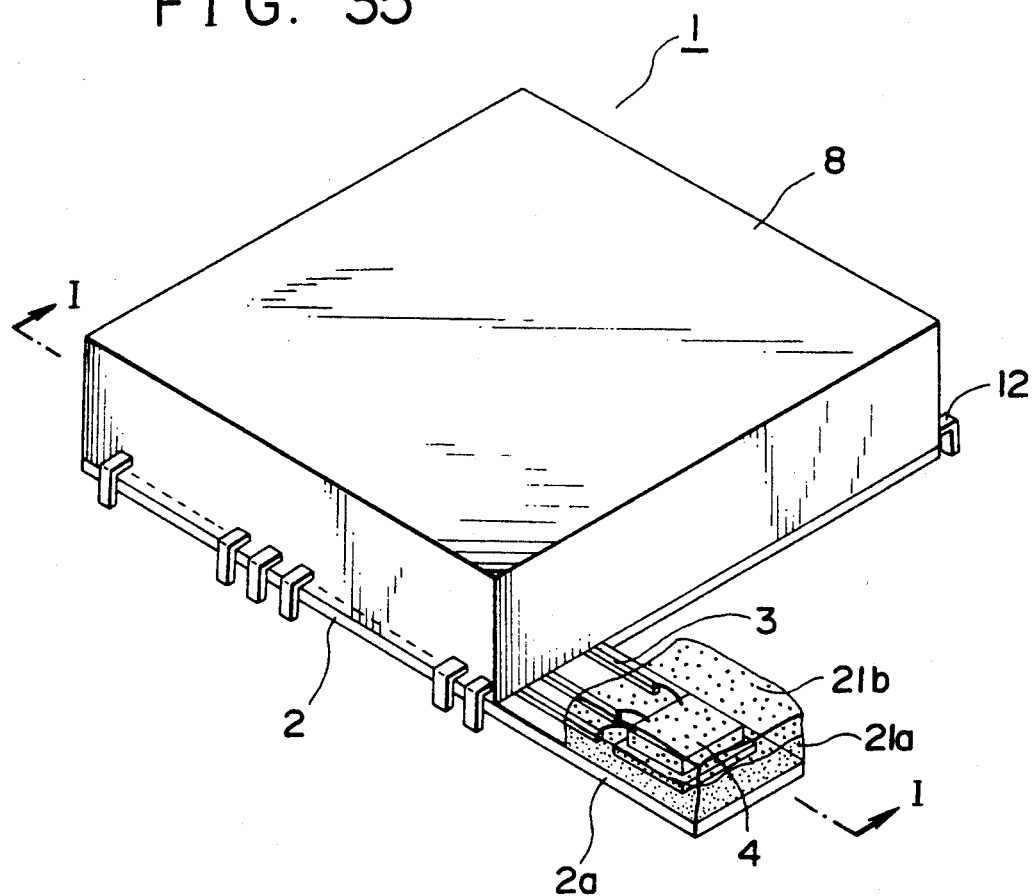
FIG. 35 and FIG. 36 are drawings showing modifications of the third embodiment of the present invention.
Figure 36:
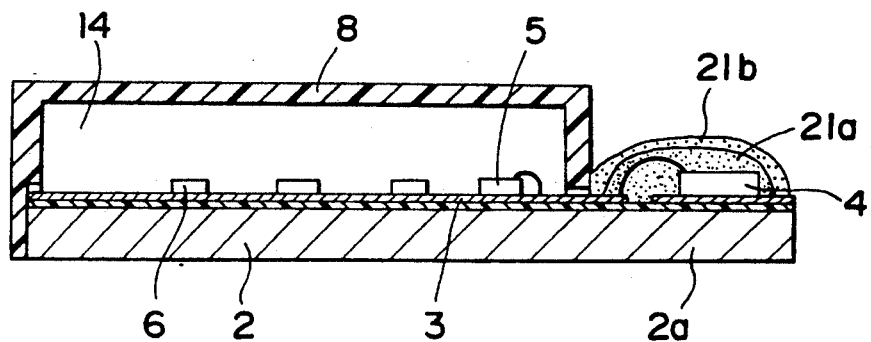

FIG. 29 to FIG. 36 show a third embodiment of the present invention. FIG. 30, FIG. 33, and FIG. 36 are sectional drawings viewed along the sections I—I in FIG. 29, FIG. 32, and FIG. 35 respectively. FIG. 31 and FIG. 34 are expanded drawings of the principal parts of FIG. 29 and FIG. 32 respectively.

Now referring to FIG. 29 and FIG. 30, in this embodiment, a hybrid integrated circuit device 1 comprises conductive paths 3 formed in a specific shape, an integrated circuit substrate 2 of which one part projects, a casing 8, and an EPROM element 4. First, the hybrid integrated circuit device 1 wherein a DIP-type EPROM element 4 is used will be explained.

The integrated circuit substrate 2 is formed in the same manner as the substrate 2 of the first embodiment. A socket 15 for the DIP-type EPROM element 4 is secured to the conductive paths 3 formed on a projecting section 2a. A microcomputer 5 and the like, which is supplied with data from the EPROM element 4, is secured to the conductive paths 3 on the non-projecting part of the integrated circuit substrate 2. The electrodes of the microcomputer 5 and the socket 15 are mutually connected by the conductive paths 3. The conductive paths 3 are formed in a specified pattern over almost the entire surface of the integrated circuit substrate 2. Pads (omitted from the drawings) to which the external lead terminals 12 are secured are formed on the conductive paths 3 extending to the near end section of the integrated circuit substrate 2. FIG. 29 shows the hybrid integrated circuit device 1 in which the external lead terminals 12 are secured to only one side of the hybrid integrated circuit device 1, but the external lead terminals 12 can be positioned at any location with the exception of the projecting section 2a.

The casing 8 is formed from an insulating thermoplastic resin in a box shape to cover the integrated circuit substrate 2 with the exception of the projecting section 2a, and form a space 14 between the casing 8 and the integrated circuit substrate 2. In the final step for fabricating the hybrid integrated circuit device 1, the peripheral end sections of the casing 8 are firmly secured to the integrated circuit substrate 2 using the seal material with adhesive properties (J-sheet: trademark), thus forming an integral body. By these means, the circuit components such as the microcomputer 5 and the like, with the exception of the EPROM element 4, the socket 15 for connecting the EPROM element 4 and a very few of the conductive paths 3 on the projecting section 2a, are sealed in the space 14 formed between the casing 8 and the integrated circuit substrate 2.

In FIG. 31, the EPROM element 4 on the projecting section 2a, the chip-type microcomputer 5, and the conductive paths 3 connecting these two components are shown in an expanded view. In order to display more accurately the projecting aspect of the shape of the projecting section 2a shown in FIG. 31, this shape is shown as being different from the shape of the projecting section 2a shown in FIG. 27. However, there are no particular restrictions with regard to the position or shape of the projecting section 2a in this embodiment. As illustrated in FIG. 31, the projecting section 2a on which the EPROM element 4 is positioned is formed adjacent to the microcomputer 5. The microcomputer 5 and the EPROM element 4 are connected by the conductive paths 3 with an extremely small space between them.

FIG. 32 to FIG. 34 show a modification of this embodiment suitable for use with a SIP-type EPROM element 4. In this modified embodiment, the SIP-type EPROM element 4 has the feature whereby a light-shielding means for the EPROM element 4 is unnecessary in the case where a light-transmitting section 13 (shown as a broken line in FIG. 32) is positioned facing the side surface of the casing 8, because the light-transmitting section 13 is shielded from light by the casing 8. With the exception of this point and the fact that the specified socket 15 suitable for the SIP-type EPROM element 4 is used, the structure is the same as for the embodiment shown in FIG. 29. Therefore, the reference numbers used in FIG. 29 are also used for the corresponding parts in this modification, so a detailed explanation will be omitted. When a DIP-type EPROM element 4 as well as SIP-type EPROM is used, it is preferable that the unit be designed to correspond the top surface of the EPROM element 4 with the top surface of the hybrid integrated circuit device 1 from the aspect of the handling and reliability of the hybrid integrated circuit device 1.

Next, with reference to FIG. 35 and FIG. 36, a modification suitable for use with the EPROM chip 4 will be explained.

Now referring to FIG. 35, the integrated circuit substrate 2 is formed in the same way as in the first embodiment, and the projecting section 2a is formed at a specified position adjacent to the microcomputer (omitted from the drawing). The EPROM chip 4 is securely positioned on the conductive paths 3 of the projecting section 2a using a plastic material such as solder or silver paste or the like. The electrode of the EPROM chip 4 is ultrasonically bonded to the end section of the specified conductive paths 3 using aluminum wire. As shown in FIG. 36, which is a sectional drawing viewed along the section I—I in FIG. 35, the microcomputer 5, the peripheral circuit elements 6, and the like are secured in the space 14 formed by the casing 8 and the integrated circuit substrate 2. The microcomputer 5 and the EPROM chip 4 are connected within the shortest distance by a plurality of conductive paths 3.

One or more layers of resin are formed on the projecting section 2a to which the EPROM chip 4 is secured. The EPROM chip 4 and the aluminum bonding wire are completely covered by these resin layers. An ultraviolet light transmitting layer 21a is used as the first layer of resin which directly covers the EPROM chip 4. There is no restriction as to the type of ultraviolet light transmitting layer 21a used, providing it is a non-aromatic resin. For example, a methyl-type silicon rubber or silicon gel can be used. In addition, a non-ultraviolet light transmitting layer 21b is used as the second layer of resin to prevent erroneous erasure of the data stored on the EPROM chip 4. An epoxy resin or polyimide resin which contains an aromatic ring (benzene ring) is used as this non-ultraviolet light transmitting layer 21b.

Using the third embodiment of the present invention, in addition to the effects obtained with the first and second embodiments, by positioning the EPROM element 4 or the EPROM chip 4 on the projecting section 2a, their contained data can be erased and rewritten with extreme ease. In addition, the space formed by the integrated circuit substrate 2 and the casing 8 can be utilized to the maximum.

Figure 37:
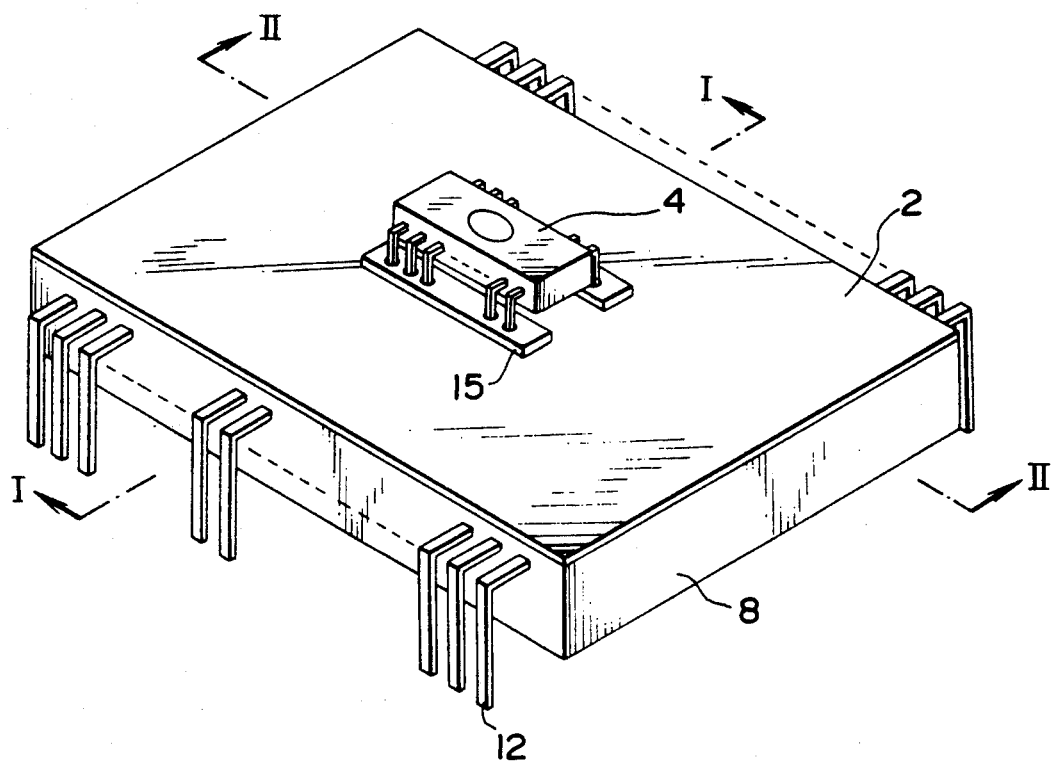
FIG. 37 and FIG. 38 are drawings showing a fourth embodiment of the present invention.
Figure 38:
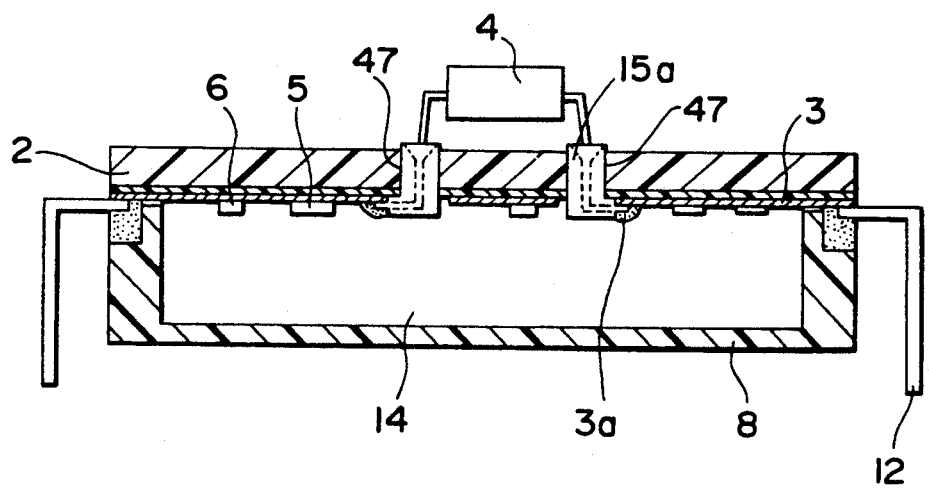
Figure 39:
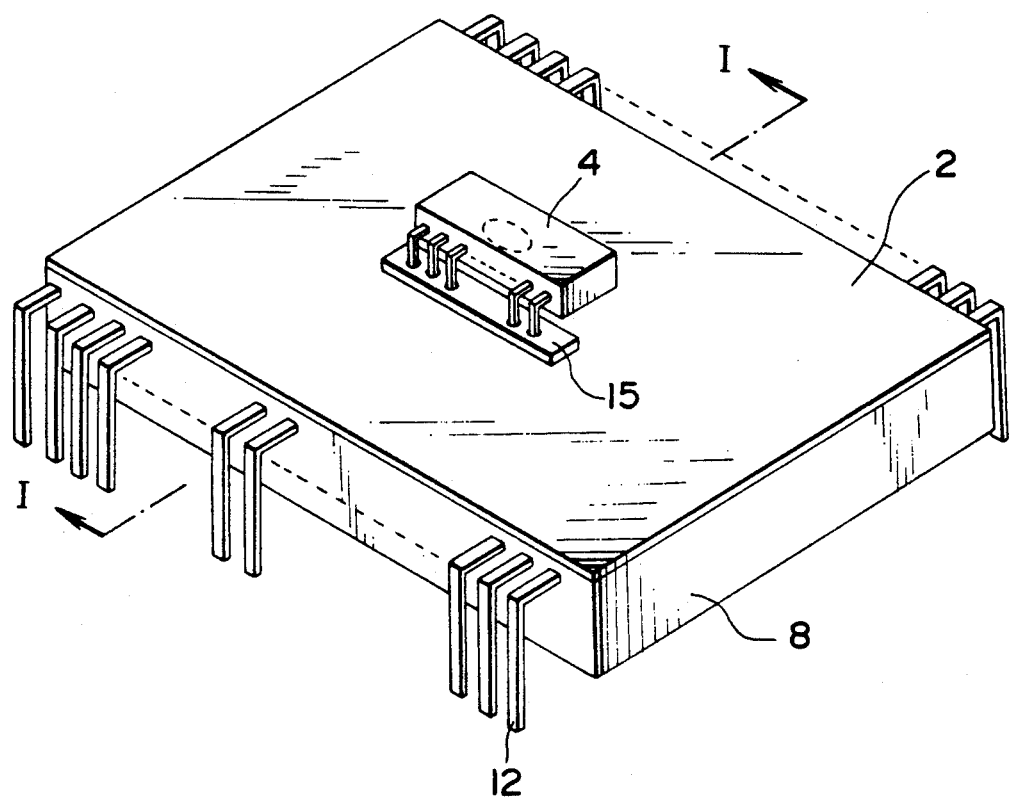
FIG. 39 is a perspective drawing showing modifications of the fourth embodiment of the present invention.
Figure 40:
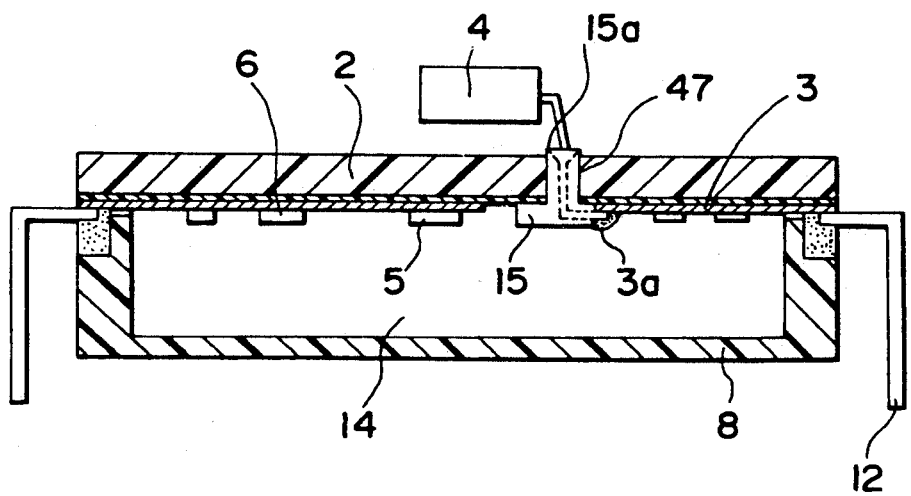
FIG. 40 is a sectional drawing viewed along the section I—I in FIG. 39.
Figure 41:
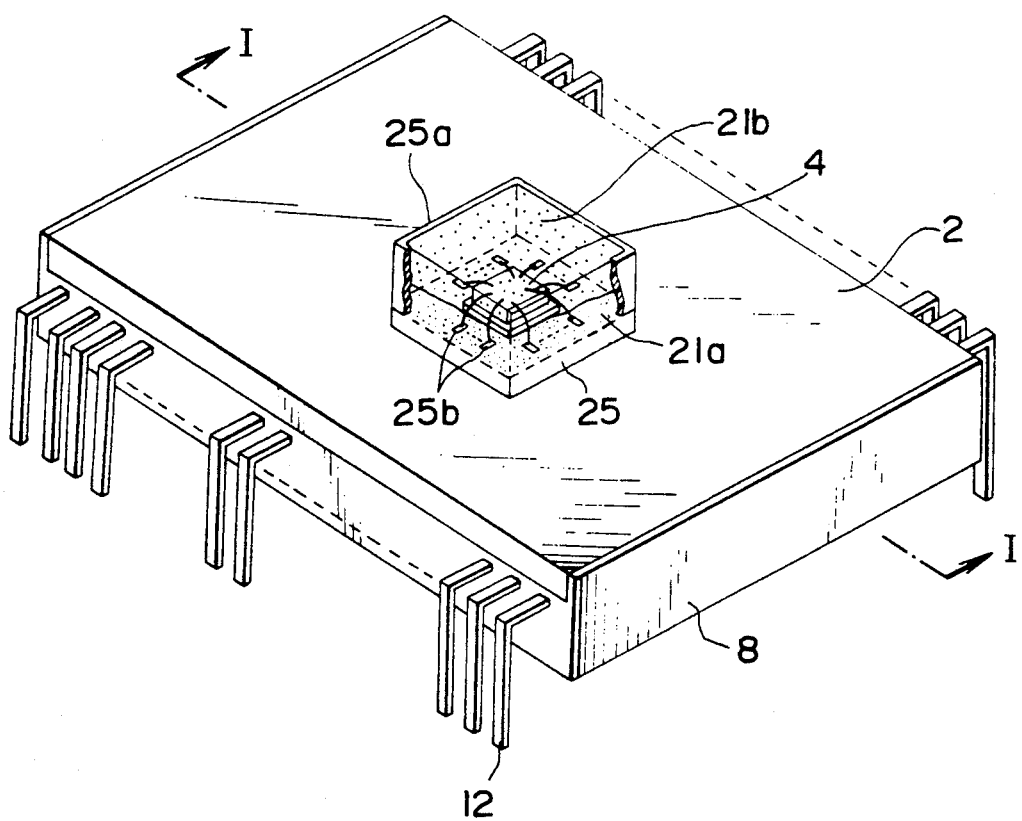
FIG. 41 is a perspective drawing showing further modifications of the fourth embodiment of the present invention.
Figure 42:
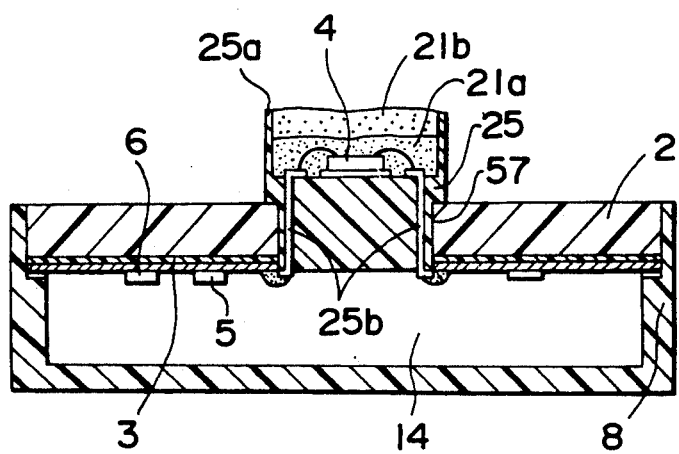
FIG. 42 is a sectional drawing viewed along the section I—I in FIG. 41.

FIG. 37 to FIG. 42 show fourth embodiment of the present invention. FIG. 38, FIG. 40, and FIG. 42 are sectional drawings viewed along the section I—I in FIG. 37, FIG. 39, and FIG. 41 respectively. In the fabrication of the casing in the first embodiment of the present invention, a space is formed to contain the EPROM. However, the same object can be attained in the fabrication of the integrated circuit substrate. The present embodiment features a means for mounting an EPROM provided on one main surface of the integrated circuit substrate, and main circuits of the hybrid integrated circuit device formed on the opposite main surface. The integrated circuit substrate is fabricated for the connection of the EPROM and the main circuits. In this embodiment notice must be taken to the fact that the upper surface of the hybrid integrated circuit device 1 is formed with the integrated circuit substrate 2.

FIG. 37 and FIG. 38 illustrate a hybrid integrated circuit device 1 suitable for use with the DIP-type EPROM element 4. On one main surface of the integrated circuit substrate 2, formed in the same manner as in the first embodiment of the present invention, the main circuits comprising a microcomputer 5, which acts in cooperation with an EPROM element 4 as will be later explained, and the peripheral circuit elements 6 and the like are formed. Also, in the initial stage of the fabrication of the integrated circuit substrate 2, two elongated holes 47 are formed in a specified position adjacent to the microcomputer 5 of the integrated circuit substrate 2 by a means such as press punching or the like, and two sockets 15 are hermetically sealed in each of these elongated holes 47. A plurality of the electrodes of these sockets 15 are connected to specified conductive paths 3 by a solder 3a. Further, securing pads are formed on the end sections of the conductive paths 3 which are extendedly provided on the peripheral side sections of the integrated circuit substrate 2, and external lead terminals 12 are secured in the opposite direction to those in the embodiments explained previously.

A casing 8 is made from an insulating thermoplastic resin and fabricated in a box shape to form a space 14 between the casing 8 and the integrated circuit substrate 2, when the casing 8 is secured to the integrated circuit substrate 2. In the final stage of fabrication of the hybrid integrated circuit device 1, the casing 8 and the integrated circuit substrate 2 are firmly secured by means of the adhesive seal material (J-sheet: trademark) to provide an integrally-formed body.

The present embodiment can be suitably modified for use with a SIP-type EPROM element 4. This modification is illustrated in FIG. 39 and FIG. 40.

In addition, the present embodiment can be suitably modified for use with an EPROM chip 4. This modification will be explained with reference to FIG. 41 and FIG. 42.

In a position adjacent to the microcomputer 5 of the integrated circuit substrate 2, formed in the same way as explained for previous embodiments, a rectangle hole 57 is formed by some means such as press punching or the like, and a header mounting body 25 is hermetically sealed in the rectangle hole 57. The header mounting body 25 is formed from a ceramic or an insulating resin such as glass-epoxy or the like in the shape shown in FIG. 41, in which a plurality of lead-out leads 25b are embedded. In addition, a frame 25a is integrally formed with the header mounting body 25 on its upper surface.

In this modification, the EPROM chip 4 is secured to a header formed from a metal layer such as, for example, copper foil, gold, silver, or the like (omitted from the drawings) at the bottom of a hole enclosed by the frame 25a of the header mounting body 25. The electrode of the EPROM chip 4 is ultrasonically bonded with aluminum wire or the like to one end of the lead-out lead 25b connected to the conductive paths 3. Also, the other end of the lead-out lead 25b is led into the space 14 formed between the casing 8 and the integrated circuit substrate 2 and is soldered or wire bonded to the end of the conductive path 3 connected to the microcomputer 5 or the like positioned on the integrated circuit substrate 2.

One or more layers of resin are filled into the space enclosed by the frame 25a on the upper surface of the header mounting body 25, providing a protective cover for the EPROM chip 4. The first layer of resin which directly covers the EPROM chip 4 is a ultraviolet light-transmitting resin 21a through which the data on the EPROM chip 4 can be erased. There is no restriction as to the type of ultraviolet light transmitting layer 21a used, providing it is a non-aromatic resin. For example, a methyl-type silicon rubber or silicon gel can be used.

For the second resin layer which is filled over the top of the first resin layer 21a, a non-UV light transmitting layer 21b is used to prevent erroneous erasure of the data on the EPROM chip 4. There are no restrictions as to the type of resin used as the non-UV light-transmitting layer 21b, providing it contains an aromatic ring (benzene ring). For example, an epoxy-type or polyimide-type resin is used.

The effects of the previously outlined embodiments can, of course, be expected with the fourth embodiment of the present invention. Because a metal integrated circuit substrate 2 is provided as the upper surface, an improvement in heat dissipation characteristics can also be expected. In particular, in an embodiment using the DIP-type EPROM element 4, it is also possible to position wiring and elements between the two sockets in the integrated circuit substrate 2. An improved degree of integration can hence be expected.

What is claimed is:

1. A hybrid integrated circuit device comprising:
   an integrated circuit substrate on which is formed a plurality of conductive paths in a specified pattern;
   a non-volatile memory connected to a specified conductive path on the integrated circuit substrate;
   a microcomputer and its peripheral circuit elements which are supplied with data from the memory and are connected to a specified conductive path on the integrated circuit substrate; and
   casing integrally formed with the integrated circuit substrate;
   wherein the casing has a hole formed therein at a specified position to expose the substrate and the specified conductive path to which the non-volatile memory is connected; the non-volatile memory is connected directly or indirectly to the conductive path on the integrated circuit substrate which is exposed by the hole; and the microcomputer and its peripheral circuit elements are positioned in a sealed space formed by the integrated circuit substrate and the casing and separated from the hole.

2. The hybrid integrated circuit device of claim 1, wherein the integrated circuit substrate is a metal substrate for which the surface has been subjected to an insulating treatment, and the conductive paths are formed by applying copper foil.

3. The hybrid integrated circuit device of claim 1, wherein the microcomputer is die bonded onto the conductive path.

4. The hybrid integrated circuit device of claim 1, wherein a plurality of chip parts such as chip resistances and chip condensers are used as the peripheral circuit elements.

5. The hybrid integrated circuit device of claim 1, wherein a socket for connecting the non-volatile memory to a specified conductive path on the integrated circuit substrate exposed by the hole is formed in the hole in the casing.

6. The hybrid integrated circuit device of claim 5, wherein the hole in the casing is formed in essentially the same shape as the external part of the non-volatile memory, and wherein the upper surface of the non-volatile memory and the upper surface of the casing essentially correspond.

7. The hybrid integrated circuit device of claim 5, wherein a light-shielding seal material is provided which extends around the periphery of the casing on the upper surface of the non-volatile memory.

8. The hybrid integrated circuit device of claim 5, wherein the non-volatile memory is a dual-in-line type, an LCC type, or a PLCC type of non-volatile memory.

9. The hybrid integrated circuit device of claim 5, wherein the non-volatile memory is a single in-line type of non-volatile memory.

10. The hybrid integrated circuit device of claim 1, wherein the non-volatile memory is a chip fixed to the integrated circuit substrate exposed by the hole formed in the casing; and electrode of the non-volatile memory chip and a specified conductive path are connected by bonding wire; these parts are sealed by a resin which essentially transmits ultraviolet light; and wherein a resin layer or a sealing material is provided to shield the upper layer section from ultraviolet light.

11. A hybrid integrated circuit device comprising:
    an integrated circuit substrate on which a plurality of conductive paths with a specified pattern is formed;
    a microcomputer and its peripheral circuit elements;
    a casing provided with a hole at a specified position thereof, and integrally formed with and secured to the integrated circuit substrate;
    a socket which is perfectly inserted in the hole, and which is connected to a specified conductive path through the electrode of the socket by means of a connector; and
    a non-volatile memory which is inserted into the socket;
    wherein the microcomputer and the peripheral circuit elements are sealed in a sealed space formed by the casing and the integrated circuit substrate and separated from the hole.

12. The hybrid integrated circuit device of claim 11, wherein a concave section of almost the same external dimensions as the non-volatile memory is formed in the section of the casing where the hole is formed; and wherein the upper surface of the non-volatile memory and the upper surface of the casing correspond.

13. The hybrid integrated circuit device of claim 11, wherein the non-volatile memory is a dual-in-line type, an LCC type, or a PLCC type of non-volatile memory.

14. The hybrid integrated circuit device of claim 11, wherein the non-volatile memory is a single in-line type of non-volatile memory; and a light-transmitting section of the non-volatile memory is positioned vis-a-vis the casing for shielding the non-volatile memory from external light.

15. A hybrid integrated circuit device comprising:

an integrated circuit substrate on which is formed a plurality of conductive paths in a specified pattern;

a non-volatile memory which is connected to a specified conductive path on the integrated circuit substrate;

a microcomputer and its peripheral circuit elements which are supplied with data from the non-volatile memory and connected to a specified conductive path on the integrated circuit substrate; and a casing integrally formed with the integrated circuit substrate;

wherein the integrated circuit substrate has a section which projects from the casing; the non-volatile memory is mounted on the projecting section; and the microcomputer and its peripheral circuit elements are positioned in a sealed space formed by the integrated circuit substrate and the casing and separated from the projecting section.

16. The hybrid integrated circuit device of claim 15, wherein the integrated circuit substrate is a metal substrate for which the surface has been subjected to an insulating treatment, and the conductive path is formed from copper foil.

17. The hybrid integrated circuit device of claim 15, wherein the microcomputer is die bonded onto the conductive path.

18. The hybrid integrated circuit device of claim 15, wherein a plurality of chip parts comprising chip resistances and chip condensers are used as the peripheral circuit elements.

19. The hybrid integrated circuit device of claim 15, wherein a socket is provided connected to a conductive path on the integrated circuit substrate; and the non-volatile memory is inserted into this socket.

20. The hybrid integrated circuit device of claim 19, wherein the upper surface of the non-volatile memory and the upper surface of the casing essentially correspond.

21. The hybrid integrated circuit device of claim 19, wherein the non-volatile memory is a dual-in-line type of non-volatile memory.

22. The hybrid integrated circuit device of claim 19, wherein the non-volatile memory is a single in-line type of non-volatile memory; and a light-transmitting section of the non-volatile memory is positioned vis-a-vis the casing for shielding the non-volatile memory from external light.

23. The hybrid integrated circuit device of claim 15, wherein the non-volatile memory is a chip secured to the projecting section of the integrated circuit substrate; and an electrode of the non-volatile memory is connected to the specified conductive path using bonding wire.

24. The hybrid integrated circuit device of claim 23, wherein a light-transmitting resin layer and a non-light-transmitting resin layer are formed on the non-volatile memory chip securing section.

25. A hybrid integrated circuit device comprising:

an integrated circuit substrate on which is formed a plurality of conductive paths in a specified pattern;

a non-volatile memory;

a connection means having an electrode for connecting the non-volatile memory to a specified conductive path on the integrated circuit substrate;

a microcomputer and its peripheral circuit elements which are supplied with data from the non-volatile memory and are connected to a specified conductive path on the integrated circuit substrate; and a casing integrally formed with the integrated circuit substrate;

wherein the casing has a hole formed therein at a specified position of the integrated circuit substrate; the connection means is hermetically sealed to the hole and one end of the electrode of the connection means is connected to a specified conductive path on the integrated circuit substrate; and the microcomputer and its peripheral circuit elements are positioned in a sealed space formed by the integrated circuit substrate and the casing and separated from the hole.

26. The hybrid integrated circuit device of claim 25, wherein the microcomputer is die bonded onto the conductive path.

27. The hybrid integrated circuit device of claim 25, wherein a plurality of chip parts such as chip resistances and chip condensers are used as the peripheral circuit elements.

28. The hybrid integrated circuit device of claim 25, wherein the non-volatile memory is a dual-in-line type of non-volatile memory; and a light-shielding seal material is provided on the upper surface of the non-volatile memory.

29. The hybrid integrated circuit device of claim 25, wherein the non-volatile memory is a single in-line type of non-volatile memory; and a light-transmitting section is positioned vis-a-vis the casing for shielding the non-volatile memory from external light.

30. The hybrid integrated circuit device of claim 25, wherein a non-volatile memory chip is used as the non-volatile memory; and the connection means is a header mounting body for mounting the non-volatile memory chip.

31. The hybrid integrated circuit device of claim 30, wherein the header mounting body is provided with a frame; and the header mounting body is sealed in a resin for which the upper layer transmits ultraviolet light.

* * * * *